(12) United States Patent
Hosoya et al.

(10) Patent No.: US 7,824,939 B2
(45) Date of Patent: Nov. 2, 2010

(54) METHOD FOR MANUFACTURING DISPLAY DEVICE COMPRISING SEPARATED AND ELECTRICALLY CONNECTED SOURCE WIRING LAYERS

(75) Inventors: Kunio Hosoya, Atsugi (JP); Saishi Fujikawa, Atsugi (JP); Yoko Chiba, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 12/254,589

(22) Filed: Oct. 20, 2008

(65) Prior Publication Data

US 2009/0104723 A1    Apr. 23, 2009

(30) Foreign Application Priority Data

Oct. 23, 2007    (JP) .............................. 2007-275786

(51) Int. Cl.
*H01L 21/00*    (2006.01)
(52) U.S. Cl. .................... 438/30; 257/59; 257/E33.001
(58) Field of Classification Search ........................ None
See application file for complete search history.

(56) References Cited

U.S. PATENT DOCUMENTS

| 4,409,134 A | 10/1983 | Yamazaki |
| 7,023,021 B2 | 4/2006 | Yamazaki et al. |
| 7,223,643 B2 | 5/2007 | Ohnuma et al. |
| 2003/0013236 A1* | 1/2003 | Nakata et al. ............... 438/149 |
| 2006/0275710 A1 | 12/2006 | Yamazaki et al. |
| 2006/0278875 A1 | 12/2006 | Ohnuma et al. |
| 2006/0290867 A1* | 12/2006 | Ahn et al. .................... 349/141 |
| 2007/0001225 A1 | 1/2007 | Ohnuma et al. |
| 2007/0023790 A1 | 2/2007 | Ohnuma et al. |
| 2007/0037070 A1 | 2/2007 | Ohnuma et al. |
| 2007/0085475 A1 | 4/2007 | Kuwabara et al. |
| 2007/0139571 A1 | 6/2007 | Kimura |
| 2007/0146592 A1 | 6/2007 | Kimura |
| 2007/0148936 A1 | 6/2007 | Ohnuma |
| 2007/0222936 A1* | 9/2007 | Shih ........................... 349/187 |

FOREIGN PATENT DOCUMENTS

| JP | 2001-313397 | 11/2001 |
| JP | 2007-133371 | 5/2007 |

OTHER PUBLICATIONS

C.W. Kim et al.; "42.1: A Novel Four-Mask-Count Process Architecture for TFT-LCDs"; SID Digest'00: SID International Symposium Digest of Technical Papers, vol. 31, pp. 1006-1009; May 2000.

* cited by examiner

*Primary Examiner*—Thanh V Pham
*Assistant Examiner*—Andres Munoz
(74) *Attorney, Agent, or Firm*—Fish & Richardson P.C.

(57) ABSTRACT

Etching is performed using mask layers formed by a multi-tone mask which is a light-exposure mask through which light is transmitted to have a plurality of intensity, in a method for manufacturing a display device including an inverted staggered thin film transistor with a channel-etched structure. Further, a gate wiring layer and a source wiring layer are formed over a substrate in the same step, and the source wiring layer is separated (disconnected) at an intersection of the gate wiring layer and the source wiring layer. The separated source wiring layers are connected to each other electrically through an opening (a contact hole) via a conductive layer formed over a gate insulating layer in the same step as formation of source and drain electrode layers.

10 Claims, 13 Drawing Sheets

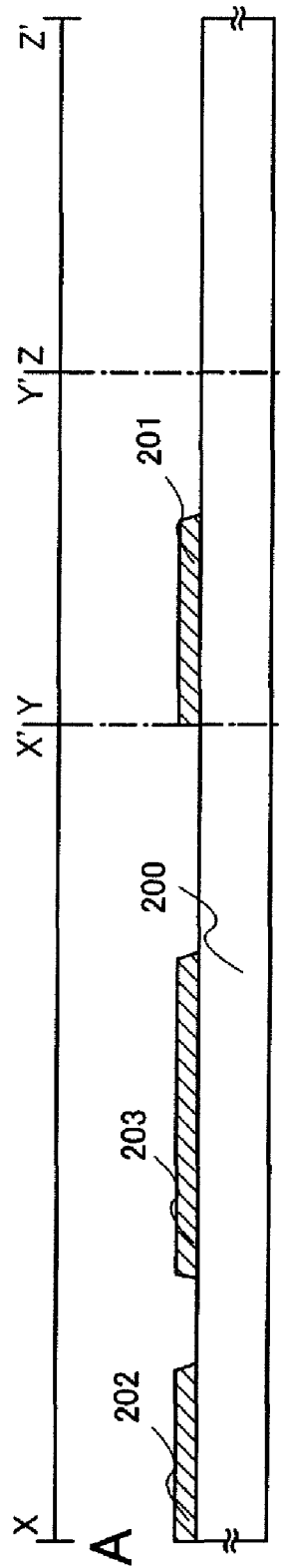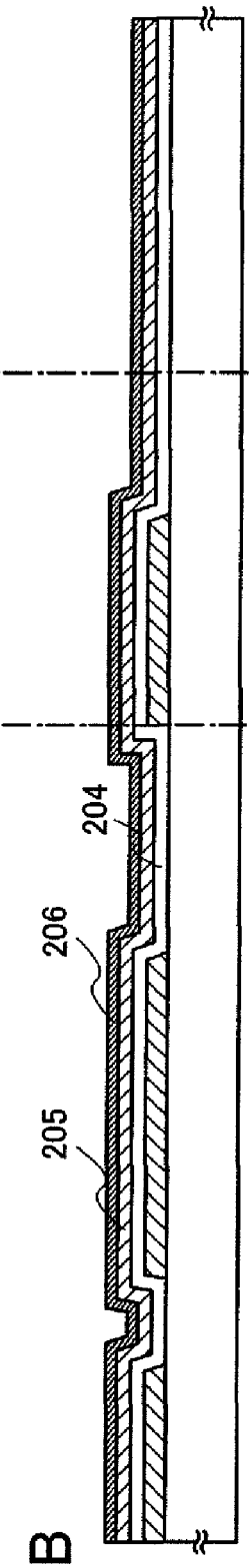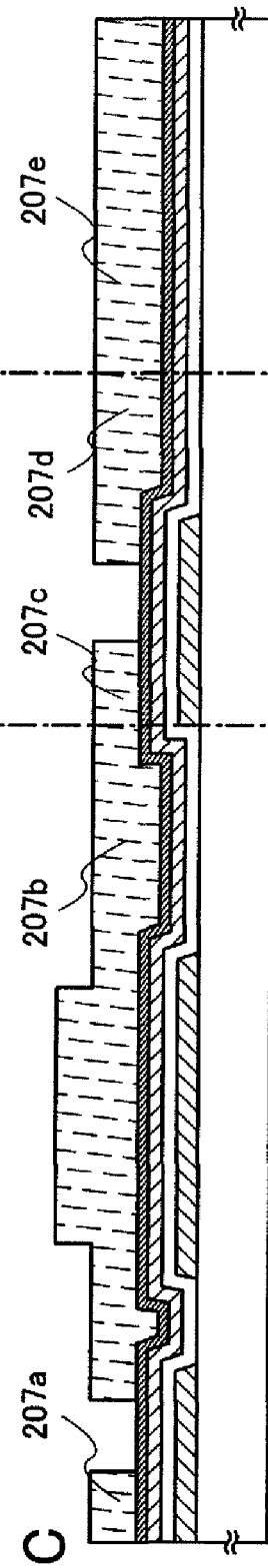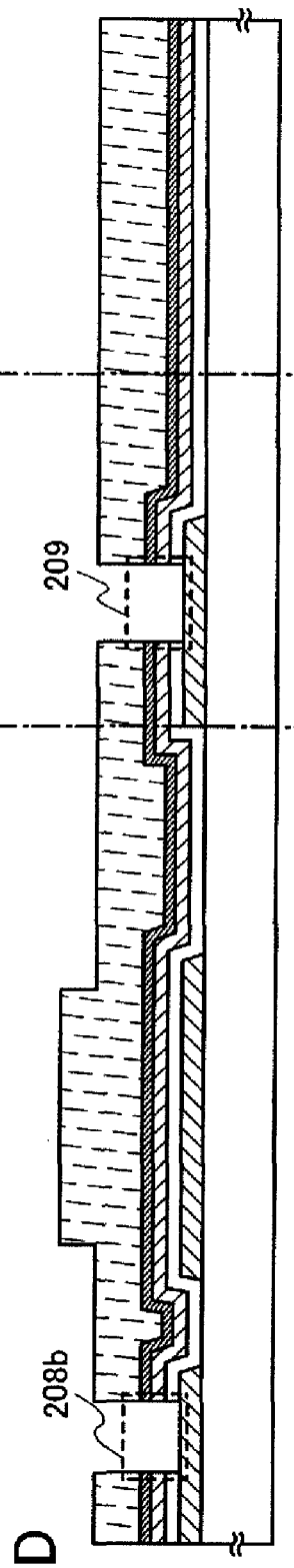

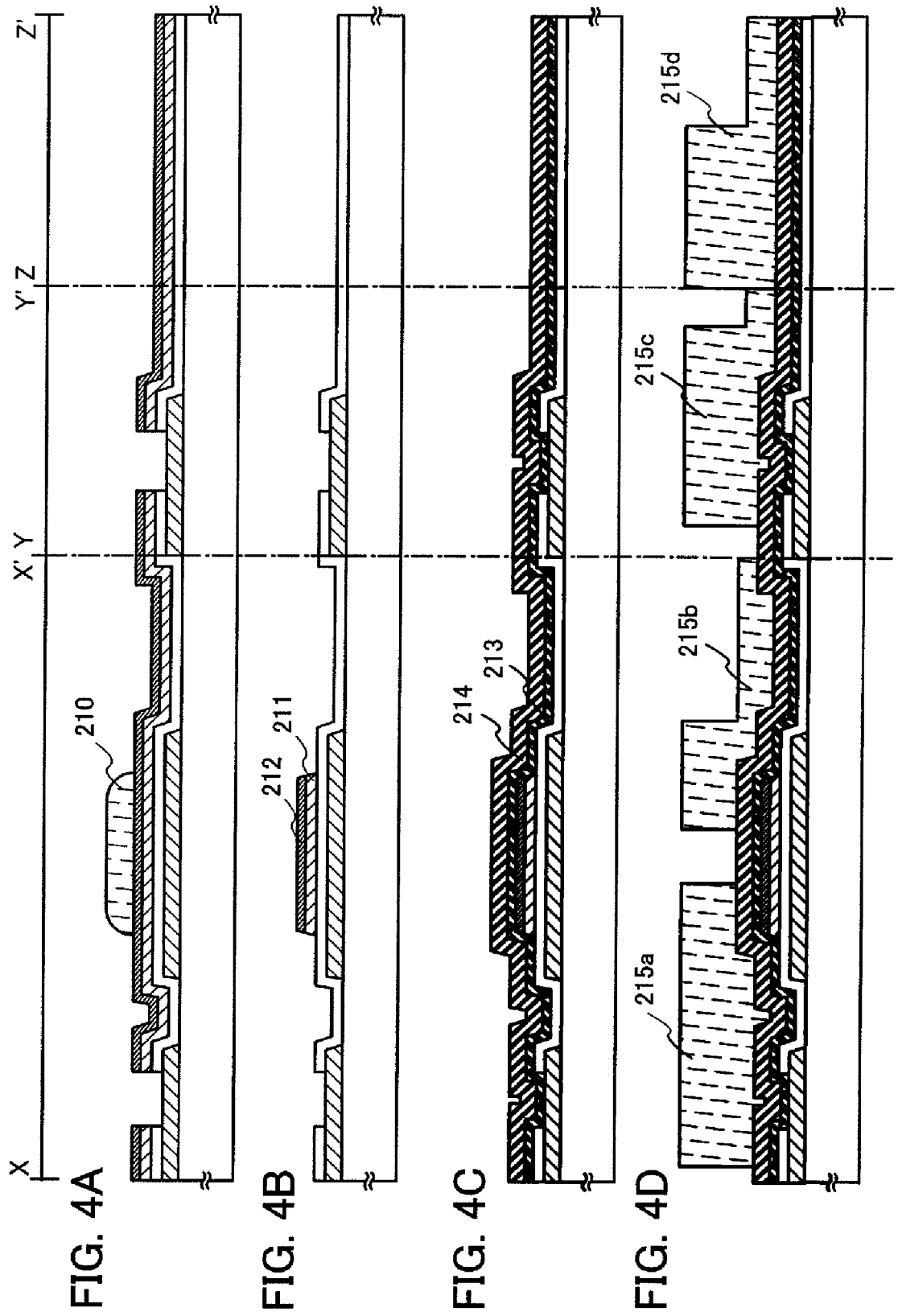

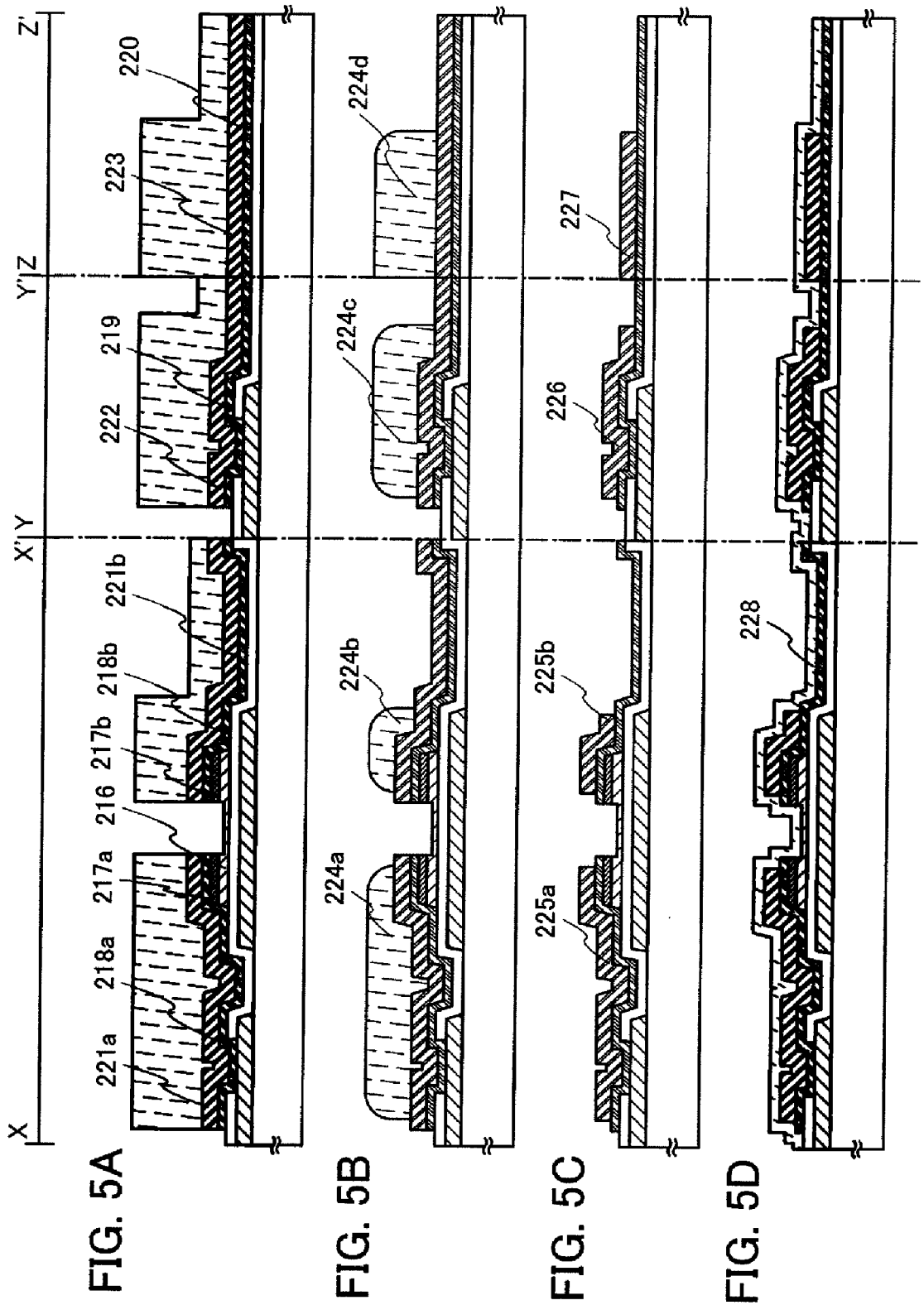

236
251a1
251a2
218a
225a
251b1
251b2
202

252a

252b

METHOD FOR MANUFACTURING DISPLAY DEVICE COMPRISING SEPARATED AND ELECTRICALLY CONNECTED SOURCE WIRING LAYERS

BACKGROUND OF THE INVENTION

1. Field of the Invention

The present invention relates to a display device in which a thin film transistor is used at least in a pixel portion and a manufacturing method thereof.

2. Description of the Related Art

In recent years, technology that is used to form a thin film transistor using a semiconductor thin film (with a thickness of from several nanometers to several hundreds of nanometers, approximately) formed over a substrate that includes an insulating surface has been attracting attention. A thin film transistor is broadly applied to electronic devices such as an IC and an electrooptic device, and particularly, a thin film transistor as a switching element of an image display device is expected to be developed quickly.

As a switching element of an image display device, a thin film transistor using amorphous semiconductor film, a thin film transistor using polycrystalline semiconductor film, or the like is used.

As a method for manufacturing a thin film transistor, a method in which a stacked structure is formed by a photolithography process using a large number of light-exposure masks (also referred to as photo masks) is employed. However, it is important for reduction in manufacturing cost or improvement of a yield to reduce the number of steps, and thus technology for reducing the number of photolithography steps, that is, reducing the number of light-exposure masks is developed (for example, see Patent document 1: Japanese Published Patent Application No. 2001-313397 and Patent Document 2: Japanese Published Patent Application No. 2007-133371).

SUMMARY OF THE INVENTION

As noticed in the above-described Patent Documents, a photolithography process is comprised of formation of a photo resist, light-exposure treatment with the use of a light-exposure mask, development, and the like. Further, the photolithography process is a process which also can be comprised of a large number of steps, such as washing treatment, a test, and the like, in addition to the above-described steps, and is a one of factors that have influence on manufacturing cost, a yield, productivity, and the like. Particularly, reducing the number of light-exposure masks whose design and manufacturing cost is high is a major problem.

In view of the above-described problem, it is one object of the present invention to manufacture a display device with high reliability at low cost while reducing the number of light-exposure masks and simplifying a photolithography process.

Etching is performed with the use of mask layers formed by a multi-tone mask which is a light-exposure mask through which light is transmitted to have a plurality of intensity in a method for manufacturing a display device including an inverted staggered thin film transistor with a channel-etched structure. Further, a gate wiring layer and a source wiring layer are formed over a substrate in the same step, and the source wiring layer is separated (disconnected) in an intersection of the gate wiring layer and the source wiring layer. The separated source wiring layers are connected to each other electrically through an opening (a contact hole) via the wiring layer formed over a gate insulating layer in the same step as formation of source and drain electrode layers.

The source and drain electrode layers are a stacks of a light-transmitting conductive layer and a conductive layer. The conductive layer is removed selectively to expose the light-transmitting conductive layer and form a pixel electrode layer.

Since a mask layer formed with the use of a multi-tone mask has a plurality of film thicknesses, and can be changed in shape by performing ashing, the mask layer can be used in a plurality of etching steps for processing into different patterns. Therefore, a mask layer corresponding at least two kinds or more of different patterns can be formed by one multi-tone mask. Thus, the number of light-exposure masks can be reduced and the number of corresponding photolithography steps can be also reduced, whereby simplification of a process can be realized.

As conductive layers for the gate wiring layer, source wiring layers, and the source and drain electrode layers, a conductive material having reflectivity to light is used. On the other hand, as the substrate and the pixel electrode, a material having light-transmitting property is used. In a light-exposure step to form the mask layers used for an etching step of an insulating film functioning as a protective film of a thin film transistor, the substrate is irradiated with light from the opposite side of the surface over which elements are formed (also referred to as the back side), and light exposure from the back surface can be performed using conductive layers having reflectivity used for the gate wiring layer, the source wiring layers, and the source and drain electrode layers, as masks. Therefore, since it is not necessary to form a light-exposure mask for etching of the insulating film, the number of photolithography steps can be further reduced.

The shape of a mask layer formed by a photolithography step can be processed by heat treatment (also referred to as reflow treatment). Since the peripheral portion of the mask layer is extended and the area thereof is increased by heat treatment, the mask layer, which can cover a lager region on the insulating film can be obtained.

The source and drain electrode layers and the pixel electrode layer are provided to be in contact with each other without an insulating film interposed therebetween, whereby parasitic capacitance generated between the source and drain electrode layers and the pixel electrode layer can be reduced. On the other hand, since the source wiring layer is formed with the gate insulating layer interposed between the source wiring layer and the pixel electrode layer, electrical failure such as a short circuit between the source wiring layer and the pixel electrode layer due to a defective shape, even in a minute design.

Therefore, the photolithography process can be simplified by reducing the number of light-exposure masks, whereby a display device with high reliability can be manufactured at low cost with high productivity.

One feature of a method for manufacturing a display device of the present invention is that a gate wiring layer over a light-transmitting substrate is formed and a first source wiring layer and a second source wiring layer are formed with the gate wiring layer interposed therebetween; a gate insulating layer is formed over the gate wiring layer, the first source wiring layer, and the second source wiring layer; a semiconductor film and a semiconductor film to which an impurity imparting one conductivity type is added are stacked over the gate insulating layer; a first mask layer is formed over the semiconductor film to which an impurity imparting one conductivity type is added; a first opening which reaches the first source wiring layer and a second opening which reaches the second source wiring layer are formed by etching the gate insulating layer, the semiconductor film, and the semiconductor film to which an impurity imparting one conductivity type is added using the first mask layer; ashing is performed on the first mask layer to form a second mask layer; a semiconductor film and a semiconductor film to which an impurity imparting one conductivity type is added are formed by etching the semiconductor film and the semiconductor film to which an impurity imparting one conductivity type is added using the second mask layer; a stacked layer of a light-transmitting conductive film and a conductive film, is formed over the gate wiring layer, the first source wiring layer, the second source wiring layer, the gate insulating layer, the semiconductor layer, and the semiconductor layer to which an impurity imparting one conductivity type is added; a third mask layer is formed over the light-transmitting conductive film and the conductive film; a semiconductor layer having a recessed portion, a source region, a drain region, source or drain electrode layers which are stacked layers of the light-transmitting conductive layer and the conductive layer are formed by etching the light-transmitting conductive film and the conductive film using the third mask layer; ashing is performed on the third mask layer to form a fourth mask layer; a pixel electrode layer is performed by performing selectively etching on the conductive layer of the source or drain electrode layers using the fourth mask layer to expose the light-transmitting conductive layer; the source and drain electrode layers which connect the first source wiring layer and the second source wiring layer to each other electrically through the first opening and the second opening are formed; as the first mask layer and the third mask layer, light-exposure masks through which light is transmitted to have a plurality of intensity are used; and a region with a thickness smaller than that of a region which is overlapped with the source region and the drain region is included in the semiconductor layer having a recessed portion.

In the above-described structure, a liquid crystal layer is formed over the light-transmitting conductive layer functioning as a pixel electrode, whereby a liquid crystal display device can be manufactured. As a region for a pixel electrode layer, the light-transmitting conductive layer is used, whereby a transmissive liquid crystal display device can be manufactured. In a region for a pixel electrode layer, a conductive layer that is partly reflective is included, whereby a semi-transmissive liquid crystal display device can be manufactured.

According to the present invention, the photolithography process can be simplified by reducing the number of light-exposure masks, whereby a display device with high reliability can be manufactured at low cost with high productivity.

BRIEF DESCRIPTION OF THE DRAWINGS

FIGS. 3A to 3D are views illustrating a method for manufacturing a display device of the present invention.

FIGS. 4A to 4D are views illustrating a method for manufacturing a display device of the present invention.

FIGS. 5A to 5D are views illustrating a method for manufacturing a display device of the present invention.

DETAILED DESCRIPTION OF THE INVENTION

Figure 1A:
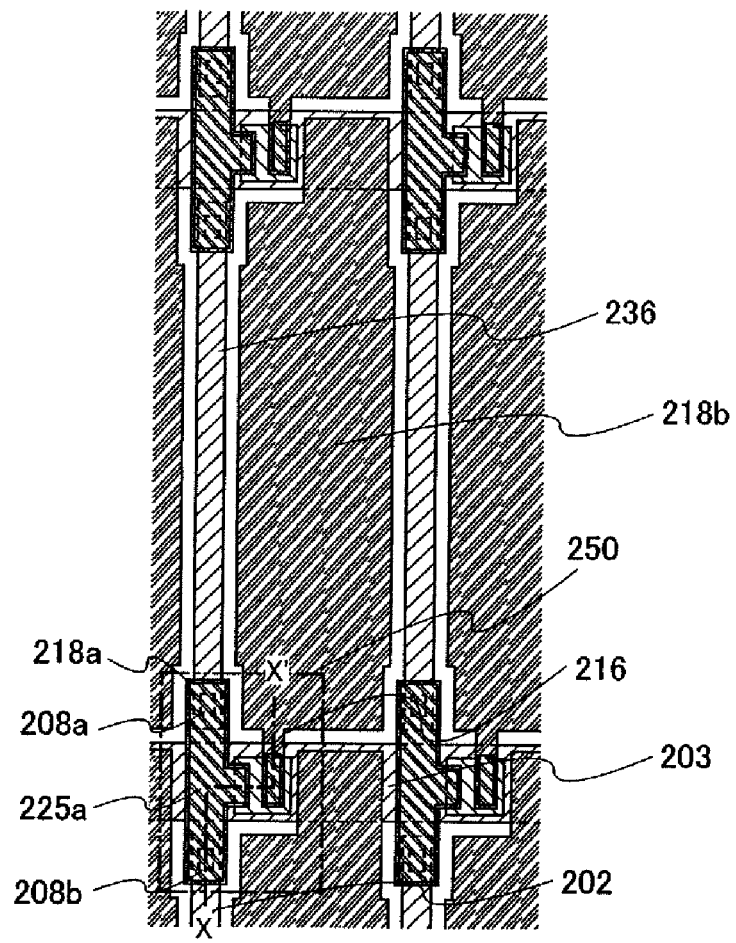
FIGS. 1A to 1C are views illustrating a display device of the present invention.

Embodiment modes of the present invention will be described with reference to the drawings. Note that the present invention is not limited to the following description, and it is easily understood by those skilled in the art that modes and details herein disclosed can be modified in various ways without departing from the spirit and the scope of the present invention. Therefore, the present invention should not to be construed as being limited to what is described in the embodiment modes. Note that the same portions or portions having a similar function are denoted by the same reference numeral through different diagrams in structures of the present invention to be described hereinafter, and repetitive description thereof is omitted.

Embodiment Mode 1

In this embodiment mode, a display device including a thin film transistor and a manufacturing method thereof will be described with reference to FIGS. 1A to 1C, FIGS. 2A to 2C, FIGS. 3A to 3D, FIGS. 4A to 4D, FIGS. 5A to 5D, FIGS. 6A to 6C, and FIGS. 7A and 7B.

An n-channel thin film transistor has higher mobility than p-channel thin film transistor. Therefore, an n-channel thin film transistor is more suitable for a driver circuit than a p-channel thin film transistor. However, in the present invention, either an n-channel thin film transistor or a p-channel thin film transistor may be employed. With any polarity of a thin film transistor, it is preferable that all the thin film transistors formed over one substrate have the same polarity so that the number of manufacturing steps is reduced. Here, description is made using an n-channel thin film transistor.

Figure 1B:
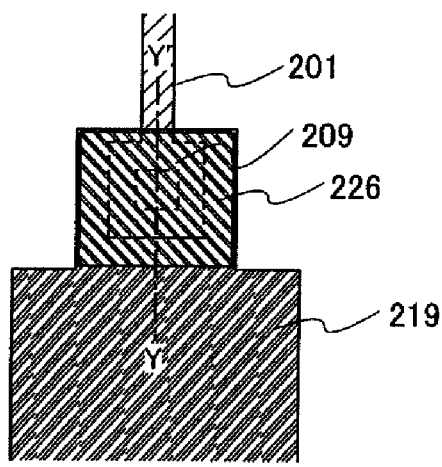
Figure 1C:
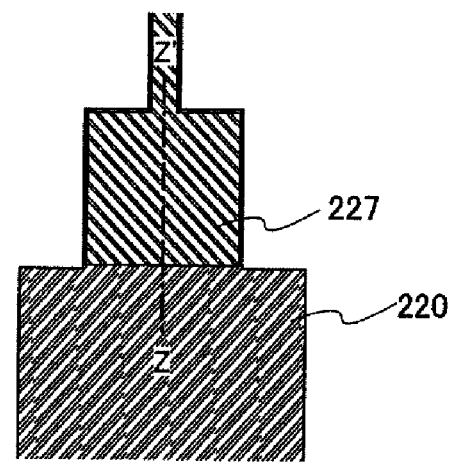
Figure 2A:
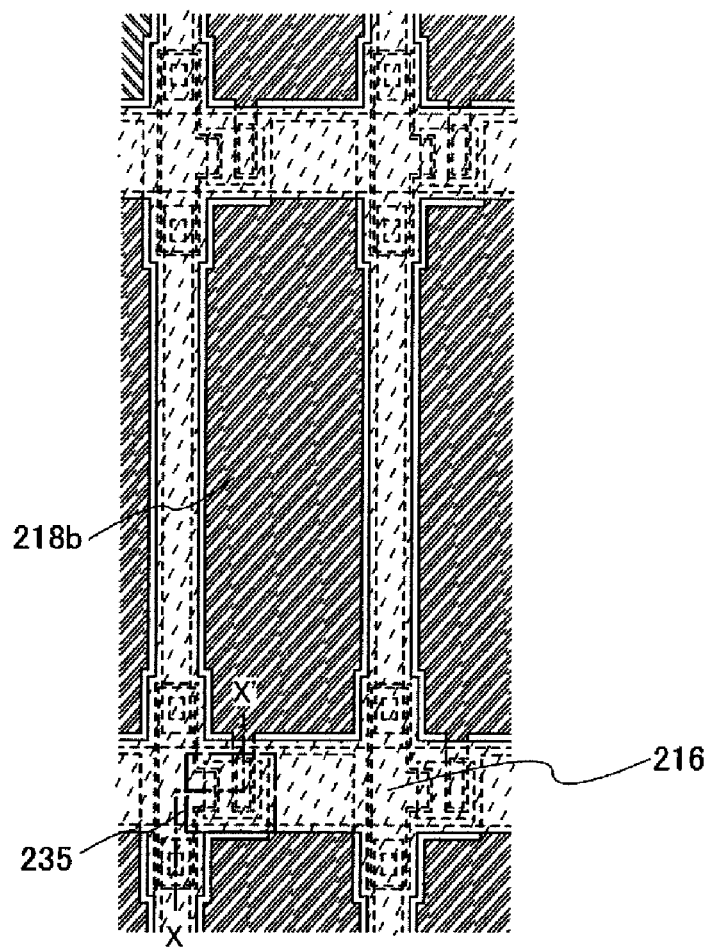
FIGS. 2A to 2C are views illustrating a method for manufacturing the display device of the present invention.

FIGS. 1A to 1C and FIGS. 2A to 2C show an example of a plane view which illustrates a display device including a thin film transistor with the use of an active matrix substrate of the present invention. In order to simplify an explanation, FIG. 1A and FIG. 2A show one pixel structure of plural pixels arranged in matrix. FIGS. 1B and 1C, and FIGS. 2B and 2C each show a terminal portion for connecting an external circuit and an active matrix substrate electrically. Further, FIGS. 3A to 3D, FIGS. 4A to 4D, FIGS. 5A to 5D, and FIGS. 6A to 6C show a process for manufacturing a display device including a thin film transistor. Cross sectional views taken along lines X-X', Y-Y', and Z-Z' in FIGS. 3A to 3D, FIGS. 4A to 4D, FIGS. 5A to 5D, and FIGS. 6A to 6C correspond to sectional views taken along lines X-X', Y-Y', and Z-Z' in FIGS. 1A to 1C and FIGS. 2A to 2C.

As shown in FIG. 1A, the active matrix substrate has plural gate wiring layers (also referred to as gate signal lines) which are arranged parallel to each other, and plural source wiring layers (also referred to as source signal lines) which intersect with each gate wiring layer. The gate wiring layer and the source wiring layer are formed over the substrate in the same step, and the source wiring layer is separated (disconnected) at an intersection of the gate wiring layer and the source wiring layer. The separated source wiring layers are connected to each other electrically through an opening (a contact hole) via the wiring layer formed over a gate insulating layer in the same step of formation of a source and a drain electrode layers.

The source and drain electrode layers are stacks of a light-transmitting conductive layer and a conductive layer (metal film). The conductive layer is removed selectively and the light-transmitting conductive layer is exposed to form a pixel electrode layer.

In a region surrounded by the gate wiring layer and the source wiring layer, the light-transmitting layer functioning as the pixel electrode is arranged, the light-transmitting conductive layer is provided to be overlapped with the gate wiring layer which is partly adjacent, so that a storage capacitor is formed.

In addition, as a switching element, a thin film transistor (also referred to as a TFT) is provided at the periphery of the intersection of the gate wiring layer and the source wiring layer. This thin film transistor is an inverted staggered thin film transistor with a channel-etched structure.

Figure 7A:
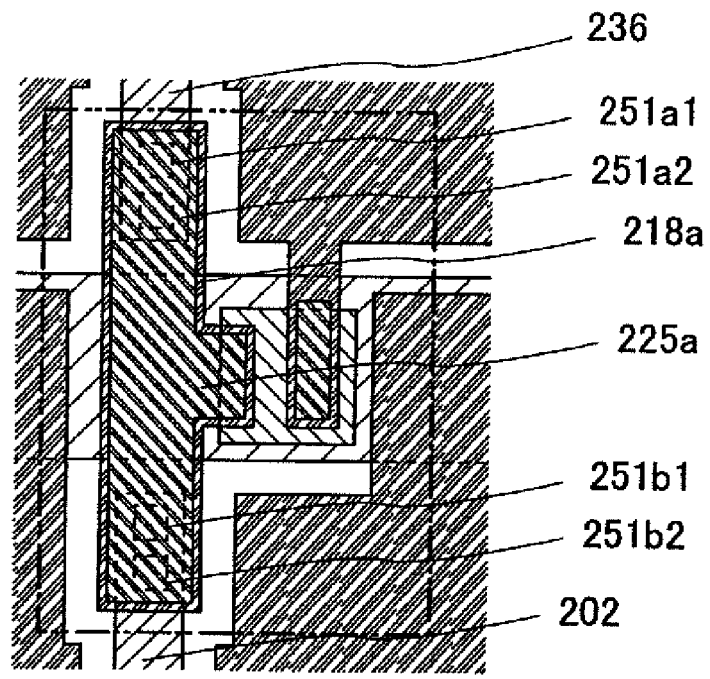
FIGS. 7A and 7B are views illustrating a display device of the present invention.
Figure 7B:
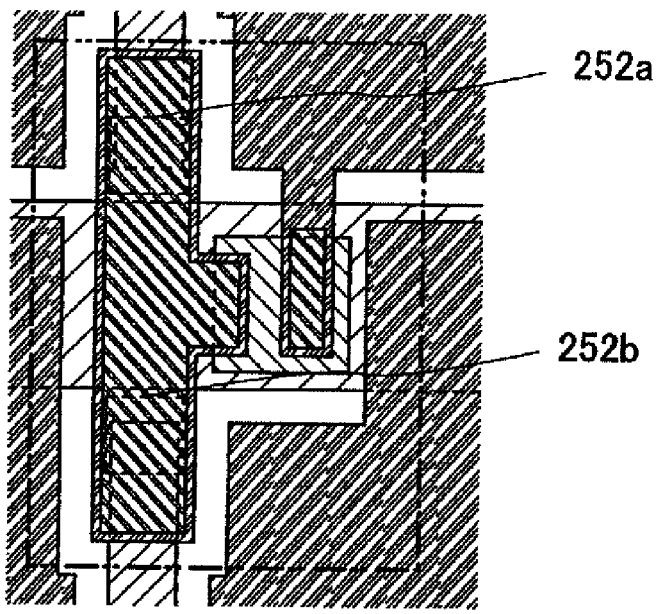

In the present invention, the separated source wiring layers are connected to each other electrically through an opening (a contact hole) via the wiring layer formed over a gate insulating layer in the same step as formation of a source and a drain electrode layer. Therefore, when poor connection occurs at the opening as a connection point, the source wiring layer loses function. FIGS. 7A and 7B show an example of a method for connecting the source wiring layer and the opening.

FIG. 7A shows an example in which plural openings of a gate insulating layer for connection are provided in order to reduce the possibility of poor connection. A source wiring layer 236 and a source wiring layer 202 are connected to each other electrically by a light-transmitting conductive layer 218a and a conductive layer 225a which are formed in openings 251a1 and 251a2, openings 251b1 and 251b2. In this case, even when contact failure occurs at one opening, function as a signal line for connection is kept in another opening. FIG. 7B is an example in which openings 252a and 252b which reaches the gate insulating layer in a position including edge portions of the source wiring layer 236 and the source wiring layer 202. Therefore, connection of the source wiring layer 236 and source wiring layer 202, and the light-transmitting conductive layer 218a and the conductive layer 225a, is also performed at the edge portions of the source wiring layer 236 and the source wiring layer 202, so that possibility of disconnection can be decreased.

Cross sectional views taken along lines Y-Y' and Z-Z' in FIGS. 1A to 1C, FIGS. 2A to 2C, FIGS. 3A to 3D, FIGS. 4A to 4D, FIGS. 5A to 5D, and FIGS. 6A to 6C each show a structure of a terminal portion. The cross sectional view taken along the line Y-Y' shows a cross sectional structure of a portion in which a wiring formed in the same step of formation of the gate wiring layer led to the pixel portion periphery is connected to a terminal. The wiring formed in the same step of formation of the gate wiring layer is connected to a stacked layer of a light-transmitting conductive layer and a conductive layer, which is formed in the same step as formation of the source and drain electrode layers through the opening in the gate insulating layer. The stacked layer has a single staked layer of the light-transmitting conductive layer before the terminal portion, and extends to the terminal portion. The cross sectional view taken along the line Z-Z' shows a cross sectional structure of a portion in which a wiring formed in the same step of formation of a source and drain electrode layers, which are led to the pixel portion periphery, is connected to a terminal. The wiring formed in the same step of formation the source and drain electrode layers that are led, is a stacked layer of a light-transmitting conductive layer and a conductive layer, and is a single layer of the light-transmitting layer in the terminal portion. In each terminal portion shown in FIGS. 1B and 1C and FIGS. 2B and 2C, the light-transmitting conductive layer which is exposed is connected to a driver circuit which is outside the substrate via a conductive adhesive material, such as an anisotropic conductive layer.

Figure 2B:
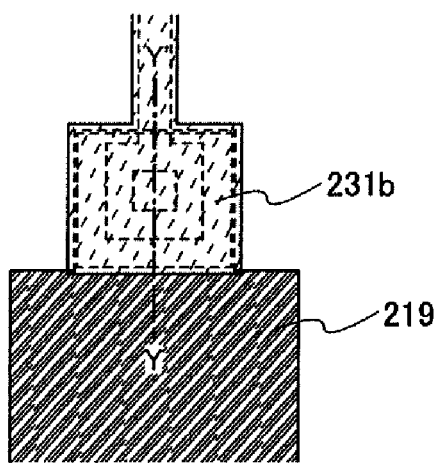
Figure 2C:
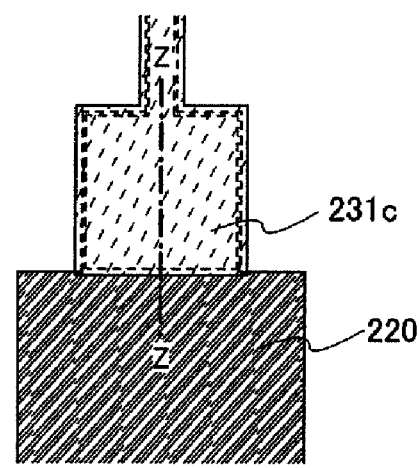

FIGS. 2A to 2C show a process in which a insulating film 231 including an opening is formed as a protective film in a pixel region after the process shown in FIGS. 1A to 1C. The insulating film 231 can prevent a thin film transistor 235 from being reduced characteristics thereof due to contaminant.

Hereinafter, a manufacturing method will be described in detail. Source wiring layers 201 and 202, and a gate wiring layer 203 are formed over a light-transmitting substrate 200 (see FIG. 3A). As the light-transmitting substrate 200, any of the following substrates can be used: non-alkaline glass substrates manufactured by a fusion method or a float method, such as barium borosilicate glass, aluminoborosilicate glass, and aluminosilicate glass; plastic substrates having heat resistant enough to withstand a process temperature of this manufacturing process; or the like. As the light-transmitting substrate 200, a substrate having a size of 320 mm×400 mm, 370 mm×470 mm, 550 mm×650 mm, 600 mm×720 mm, 680 mm×880 mm, 730 mm×920 mm, 1000 mm×1200 mm, 1100 mm×1250 mm, 1150 mm×1300 mm, 1500 mm×1800 mm, 1900 mm×2200 mm, 2160 mm×2460 mm, 2400 mm×2800 mm, 2850 mm×3050 mm, or the like can be used.

The source wiring layers 201 and 202, and the gate wiring layer 203 are formed of a metal material such as titanium, molybdenum, chromium, tantalum, tungsten, or aluminum, or an alloy material thereof The source wiring layers 201 and 202, and the gate wiring layer 203 can be formed as follows: a conductive film is formed over the light-transmitting substrate 200 by a sputtering method or a vacuum evaporation method; mask layer is formed over the conductive film by a photolithography technique or an inkjet method; and the conductive film is etched using the mask layer. Alternatively, the source wiring layers 201 and 202, and the gate wiring layer 203 can be formed by discharging a conductive nanopaste of silver, gold, copper, or the like by an inkjet method and baking it. Note that a nitride film of the above-described metal material may be provided between the source wiring layers 201 and 202, the gate wiring layer 203, and the light-transmitting substrate 200, as a barrier metal to improve adhesion of the source wiring layers 201 and 202, and the gate wiring layer 203 and prevent diffusion.

Further, the source wiring layers 201 and 202, and the gate wiring layer 203 may have a stacked layer structure, and a barrier metal film may be formed in the upper layer as a barrier metal. The light-transmitting substrate 200 may have a stacked layer structure, such stacked layers of, from the light-transmitting substrate 200 side, an aluminum film and a molybdenum film, a copper film and a molybdenum film, a copper film and a titanium nitride film, or a copper film and a tantalum nitride film. It is preferable that the source wiring layers 201 and 202, and the gate wiring layer 203 be a low resistance material such as aluminum. In the above-described stacked layer structure, a molybdenum film or a nitride film such as a titanium nitride film or a tantalum nitride film, which is barrier metal and formed in the upper layer, has an effect as a barrier metal.

Note that since a semiconductor film and/or a wiring are formed over the source wiring layers 201 and 202, and the gate wiring layer 203, the source wiring layers 201 and 202, the gate wiring layer 203 are preferably processed to have tapered edge portions so that the semiconductor film and the wiring thereover are not disconnected.

Next, a gate insulating layer 204, a semiconductor film 205, and a semiconductor film 206 to which an impurity imparting one conductivity type is added are formed in this order over the source wiring layers 201 and 202, and the gate wiring layer 203 (see FIG. 3B).

Note that the gate insulating layer 204, the semiconductor film 205, and the semiconductor film 206 to which an impurity imparting one conductivity type is added may be formed successively without being exposed to the atmosphere. Note that by depositing successively the gate insulating layer 204, the semiconductor film 205, and the semiconductor film 206 to which an impurity imparting one conductivity type is added without being exposed to the atmosphere, whereby each interface between the stacked layers can be formed without being contaminated by atmospheric components or contaminating impurities contained in the atmosphere. Thus, variations in the characteristics of thin film transistors can be reduced.

The gate insulating film 204 can be formed of a silicon oxide film, a silicon nitride film, a silicon oxynitride film, or a silicon nitride oxide film by a CVD method, a sputtering method, or the like. In this embodiment mode, a mode is described, in which a silicon nitride film or a silicon nitride oxide film, and a silicon oxide film or a silicon oxynitride film are stacked in this order as the gate insulating layer 204. Note that the gate insulating layer can be formed by stacking not two layers but three layers of a silicon nitride film or a silicon nitride oxide film, a silicon oxide film or a silicon oxynitride film, and a silicon nitride film or a silicon nitride oxide film in this order from the substrate side. Alternatively, the gate insulating layer can be formed of a single layer of a silicon oxide film, a silicon nitride film, a silicon oxynitride film, or a silicon nitride oxide film. Further, the gate insulating layer is preferably formed by a microwave plasma CVD apparatus with a frequency of 1 GHz. A silicon oxynitride film or a silicon nitride oxide film which is formed by a microwave plasma CVD apparatus has high withstand voltage, and thus, reliability of a thin film transistor to be formed later can be increased.

As an example of the three layer structure of the gate insulating layer, a silicon nitride film or a silicon nitride oxide film over a gate electrode layer as a first layer, a silicon oxynitride film as a second layer, and a silicon nitride film as a third layer, and a semiconductor film over the silicon nitride film as a top layer may be formed. In this case, the silicon nitride film or the silicon nitride oxide film as the first layer is preferably thicker than 50 nm and has an effect as a barrier which blocks impurities such as sodium, an effect of preventing a hillock of the gate electrode, an effect of preventing oxidation of the gate electrode, and the like. The silicon nitride film as the third layer has effects of improving adhesion of the semiconductor film and preventing oxidation thereof.

An ultrathin nitride film such as a silicon nitride film is formed on a surface of the gate insulating layer as described above, whereby adhesion of the semiconductor film can be improved. The nitride film may be formed by a plasma CVD method, or by nitridation treatment that is treatment with plasma which is generated by microwaves and has high density and low temperature. In addition, the silicon nitride film or the silicon nitride oxide film may be also formed when a reaction chamber is subjected to silane flush treatment.

Here, a silicon oxynitride film refers to a film which contains more oxygen than nitrogen and contains oxygen, nitrogen, silicon, and hydrogen at concentrations ranging from 55 to 65 at. %, 1 to 20 at. %, 25 to 35 at. %, and 0.1 to 10 at. %, respectively. Further, a silicon nitride oxide film refers to a film that contains more nitrogen than oxygen and includes oxygen, nitrogen, silicon, and hydrogen at concentrations ranging from 15 at. % to 30 at. %, 20 at. % to 35 at. %, 25 at. % to 35 at. %, and 15 at. % to 25 at. %, respectively.

In the case where an n-channel thin film transistor is formed, phosphorus may be added as a typical impurity element to the semiconductor film 206 to which an impurity imparting one conductivity type is added, and an impurity gas such as $PH_3$ may be added to silicon hydride. In the case where a p-channel thin film transistor is formed, boron may be added as a typical impurity element, and an impurity gas such as $B_2H_6$ may be added to silicon hydride. The semiconductor film 206 to which an impurity imparting one conductivity type is added can be formed of an amorphous semiconductor, a microcrystalline semiconductor, or a polycrystalline semiconductor. The semiconductor film 206 to which an impurity imparting one conductivity type is added is preferably formed to be a thickness of 2 nm to 50 nm (preferably 10 nm to 30 nm).

Mask layers 207a to 207e are formed over the semiconductor film 205 and the semiconductor film 206 to which an impurity imparting one conductivity type is added (see FIG. 3C).

In this embodiment mode, an example in which light exposure using a multi-tone (high-tone) mask is performed for forming the mask layers 207a to 207e is described. In order to form the mask layers 207a to 207e, a resist is formed. As the resist, a positive type resist or a negative type resist can be used. In this case, a positive type resist is used.

Next, the resist is irradiated with light with the use of a multi-tone mask 59 as a light-exposure mask, and the resist is exposed to the light.

Here, light exposure using the multi-tone mask 59 is described with reference to FIGS. 13A to 13D.

A multi-tone mask can achieve three levels of light exposure, an exposed portion, a half-exposed portion, and an unexposed portion, and is a mask through which light is transmitted to have a plurality of intensity. One-time light exposure and development process allows a resist mask with regions of plural thicknesses (typically, two kinds of thicknesses) to be formed. Thus, the number of light-exposure masks can be reduced by using a multi-tone mask.

Figure 13A:
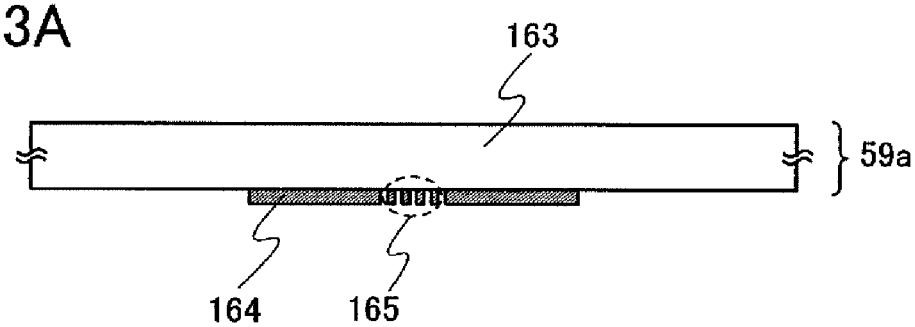
FIGS. 13A to 13D are views illustrating multi-tone photo masks applicable to the present invention.
Figure 13B:
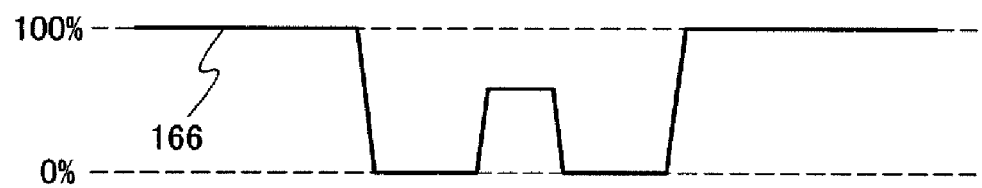
Figure 13C:
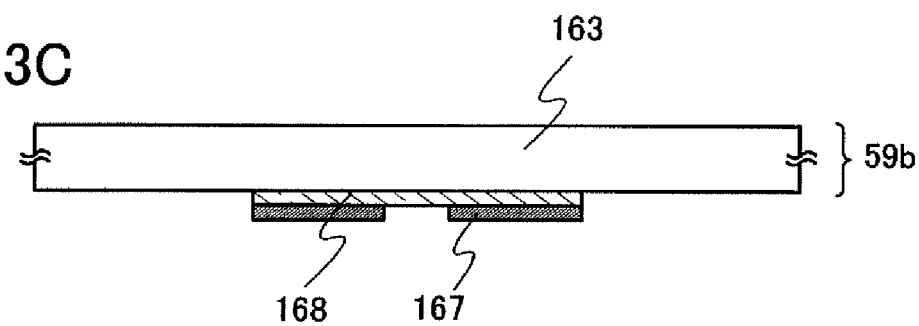

As typical examples of the multi-tone mask, a gray-tone mask 59a shown in FIG. 13A and a half-tone mask 59b shown in FIG. 13C are given.

As shown in FIG. 13A, the gray-tone mask 59a includes a light-transmitting substrate 163, and a light-blocking portion 164 and a diffraction grating 165 that are formed thereon. The light transmittance of the light-blocking portion 164 is 0%. The diffraction grating 165 has a light transmit portion in a slit form, a dot form, a mesh form, or the like with intervals less than or equal to the resolution limit of light used for the light exposure; thus, the light transmittance can be controlled. The diffraction grating 165 can be in a slit form, a dot form, or a mesh form with regular intervals; or in a slit form, a dot form, or a mesh form with irregular intervals.

As the light-transmitting substrate 163, a substrate that can transmit light, such as a quartz substrate, can be used. The light-blocking portion 164 and the diffraction grating 165 can be formed using a light-blocking material which absorbs light such as chromium or chromium oxide.

When the gray-tone mask 59*a* is irradiated with light for light exposure, a light transmittance 166 of the light block portion 164 is 0% and that in a region where neither the light block portion 164 nor the diffraction grating 165 are provided is 100%, as shown in FIG. 13B. The light transmittance of the diffraction grating 165 can be controlled in a range of 10% to 70%. The light transmittance of the diffraction grating 165 can be controlled with an interval or a pitch of slits, dots, or meshes of the diffraction grating.

As shown in FIG. 13C, the half-tone mask 59*b* includes the light-transmitting substrate 163, and a semi-transmissive portion 167 and a light-blocking portion 168 that are formed thereon. MoSiN, MoSi, MoSiO, MoSiON, CrSi, or the like can be used for the semi-transmissive portion 167. The light-blocking portion 168 can be formed using a light-blocking material which absorbs light, such as chromium or chromium oxide.

Figure 13D:
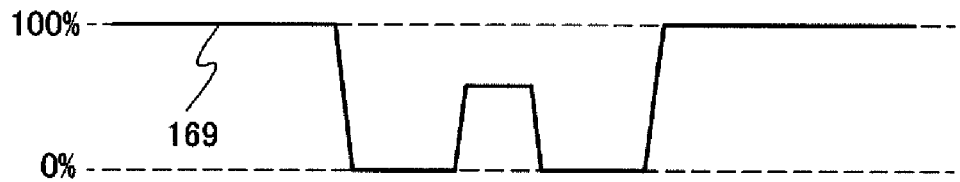

When the half-tone mask 59*b* is irradiated with light for light exposure, the light transmittance 169 of the light block portion 168 is 0% and that of a region where neither the light block portion 168 nor the semi-transmissive portion 167 is provided is 100%, as shown in FIG. 13D. The light transmittance of the semi-transmissive portion 167 can be controlled in a range of 10% to 70%. The light transmittance of the semi-transmissive portion 167 can be controlled with the material of the semi-transmissive portion 167.

The light exposure using the multi-tone mask, and then development is performed, whereby the mask layers 207*a* to 207*e* including regions with different thicknesses can be formed as shown in FIG. 3C.

Next, the gate insulating layer 204, the semiconductor film 205, and the semiconductor layer 206 to which an impurity imparting one conductivity type is added are etched using the mask layers 207*a* to 207*e*, and an opening 208*a* which reaches the source wiring layer 236, an opening 208*b* which reaches the source wiring layer 202, and an opening 209 which reaches the source wiring layer 201 are formed (see FIG. 3D).

Then, ashing is performed on the mask layers 207*a* to 207*e*. As a result, each area of the mask layers 207*a* to 207*e* is decreased, and each thickness thereof is reduced. At this time, resists of the mask layers 207*a* to 207*e* in regions with small thicknesses are removed, so that a mask layer 210 can be formed (see FIG. 4A).

The semiconductor film 205 and the semiconductor film 206 to which an impurity imparting one conductivity type is added are etched using the mask layer 210, and a semiconductor layer 211 and a semiconductor layer 212 to which an impurity imparting one conductivity type is added are formed (see FIG. 4B). After that, the mask layer 210 is removed.

Since a mask layer formed with the use of a multi-tone mask as a light-exposure mask has a plurality of film thicknesses, and can be changed shapes thereof by performing ashing, the mask layer can be used in a plurality of etching steps to process into different patterns. Therefore, a mask layer corresponding at least two kinds or more of different patterns can be formed by one multi-tone mask. Thus, the number of light-exposure masks can be reduced and corresponding photolithography steps, whereby simplification of steps can be realized.

A light-transmitting conductive film 213 and a conductive film 214 are stacked to be formed in this order over the openings 208*b* and 209, the gate insulating layer 204, the semiconductor layer 211, and the semiconductor layer 212 to which an impurity imparting one conductivity type is added (see FIG. 4C). In this embodiment mode, the conductive film 214 is metal film having reflectivity to light.

As the light-transmitting conductive film 213, a conductive material having a light-transmitting property can be used, such as indium oxide which includes tungsten oxide, indium zinc oxide which includes tungsten oxide, indium oxide which includes titanium oxide, indium tin oxide which includes titanium oxide, indium tin oxide (hereinafter referred to as ITO), indium zinc oxide, or indium tin oxide to which silicon oxide is added.

Further, a conductive composition including a conductive high molecule (also referred to as a conductive polymer) is used for the light-transmitting conductive film 213. Sheet resistance of the light-transmitting conductive film formed using a conductive composition is preferably less than or equal to 10000 Ω/square and light transmittance thereof is preferably greater than or equal to 70% at a wavelength of 550 nm. In addition, the resistivity of the conductive high molecule included in the conductive composition is preferably less than or equal to 0.1 Ω·cm.

As the conductive high molecule, a so-called π electron conjugated conductive high molecule can be used. For example, polyaniline or derivatives thereof, polypyrrole or derivatives thereof, polythiophene or derivatives thereof, and copolymers of two or more kinds of those materials can be given.

The conductive film 214 can be formed using a metal film having reflectivity. The conductive film is preferable formed to have a single layer or a stacked layer using a material such as titanium, tungsten, nickel, gold, platinum, silver, copper, tantalum, molybdenum, aluminum, magnesium, calcium, lithium, or an alloy or nitride thereof. Further, a film in contact with the semiconductor film to which added an impurity imparting one conductivity type is added may be formed of titanium, tantalum, molybdenum, or tungsten, or nitride thereof, and aluminum or an aluminum alloy may be formed thereover to form a stacked layer structure. Alternatively, the conductive film may have a stacked layer structure where a top and bottom surface of the aluminum or the aluminum alloy each may be covered with titanium, tantalum, molybdenum, tungsten, or nitride thereof.

The conductive film 214 may be formed by a sputtering method or a vacuum evaporation method. Alternatively, the conductive film 214 may be formed by discharging a conductive nanopaste of silver, gold, copper, or the like by using a screen printing method, an inkjet method, or the like and baking it.

Mask layers 215*a* to 215*d* are formed over the light-transmitting film 213 and the conductive film 214 (see FIG. 4D). In this embodiment mode, light exposure is performed on the mask layers 215*a* to 215*d* with the use of a multi-tone (high-tone) mask similar to the mask layers 207*a* to 207*d*.

After the light exposure using the multi-tone mask, development is performed, whereby the mask layers 215*a* to 215*d* including regions with different thicknesses can be formed as shown in FIG. 4D.

The semiconductor layer 211 and the semiconductor layer 212 to which an impurity imparting one conductivity type is added, the light-transmitting conductive film 213, and the conductive film 214 are etched using the mask layers 215*a* to 215*d*, and a semiconductor layer 216 having a recessed portion, source or drain regions 217*a* and 217*b* that are semiconductor layers to which an impurity imparting one conductivity type is added, light-transmitting conductive layers 218*a*, 218*b*, 219, and 220, and conductive layers 221*a*, 221*b*, 222, and 223 are formed (see FIG. 5A).

Next, ashing is performed on the mask layers 215a to 215d. As a result, the areas and the thicknesses of the mask layers 215a to 215d are reduced. At this time, regions with small thickness in resists of the mask layers 215a to 215d are removed, so that mask layers 224a to 224d can be formed (see FIG. 5B). In addition, since ashing is performed on the mask layers 215a to 215d isotropically, edge portions of the mask layers 224a to 224d are receded and reduced, which are not aligned with edge portions of the mask layers 215a to 215d.

The conductive layers 221a, 221b, 222, and 223 are etched using the mask layers 224a to 224d, whereby conductive layers 225a and 225b which function as source or drain electrode layers, a conductive layer 226, and a conductive layer 227 are formed (see FIG. 5C).

The conductive layer 221b over the light-transmitting conductive layer 218b is removed selectively, and the light-transmitting conductive layer 218b is exposed, whereby a pixel electrode layer is formed. As a region for a pixel electrode, the light-transmitting conductive layer is used, whereby a transmissive liquid crystal display device can be manufactured. As a region for a pixel electrode layer, a conductive layer that is partly reflective is left, whereby a semi-transmissive liquid crystal display device can be manufactured.

The shapes of the mask layers 224a to 224d are reflected in the conductive layers 225a and 225b, and edge portions of the conductive layers 225a and 225b are not aligned with edge portions of stacks of the light-transmitting conductive layers 218a and 218b, and the source or drain regions 217a and 218b, and further receded and reduced. Therefore, the light-transmitting layers 218a and 218b, and the source or drain regions 217a and 217b are extended outside of the conductive layers 225a and 225b. Similarly, the light-transmitting conductive layers 219 and 220 are extended outside the conductive layers 226 and 227. After that, the mask layers 224a to 224d are removed.

Next, an insulating film 228 is formed over the conductive layers 225a and 225b, the conductive layers 226 and 227, the light-transmitting layers 218a, 218b, 219, and 220, the source and drain regions 217a and 217b, the semiconductor layer 216 having a recessed portion, and the gate insulating layer 204 (see FIG. 5D).

The insulating film 228 can be formed in a similar manner to the gate insulating layer 204. Note that the insulating film 228 is formed to prevent intrusion of contaminating impurities such as organic substance, metal, or water vapor contained in the atmosphere. Therefore, the insulating film 228 is preferably formed to be a dense film. In this embodiment mode, a silicon nitride film is used.

Figure 6A:
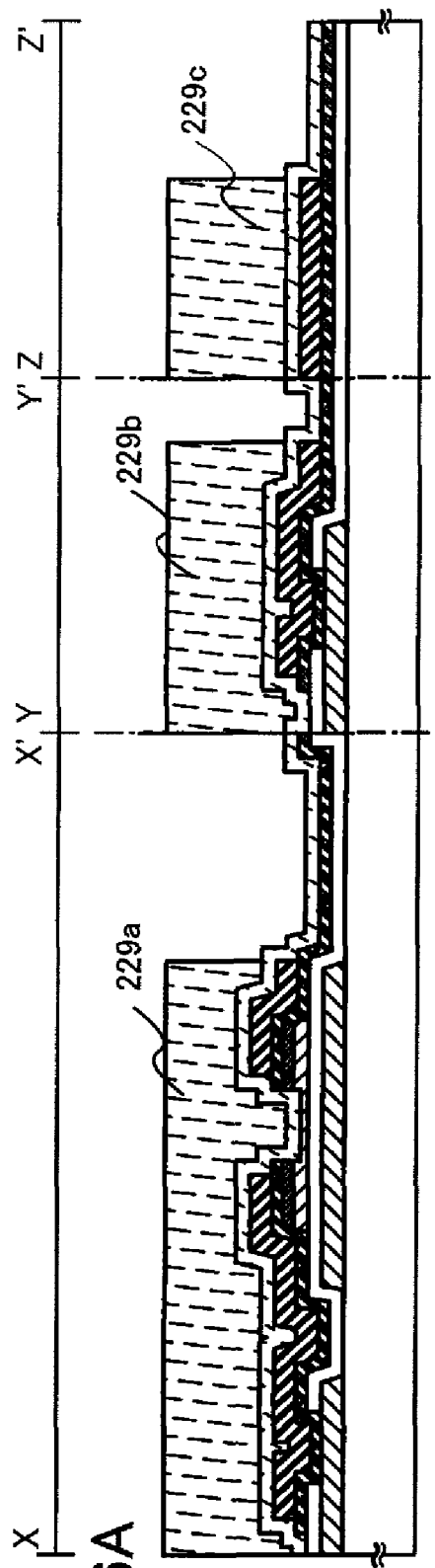
FIGS. 6A to 6C are views illustrating a method for manufacturing a display device of the present invention.
Figure 6B:
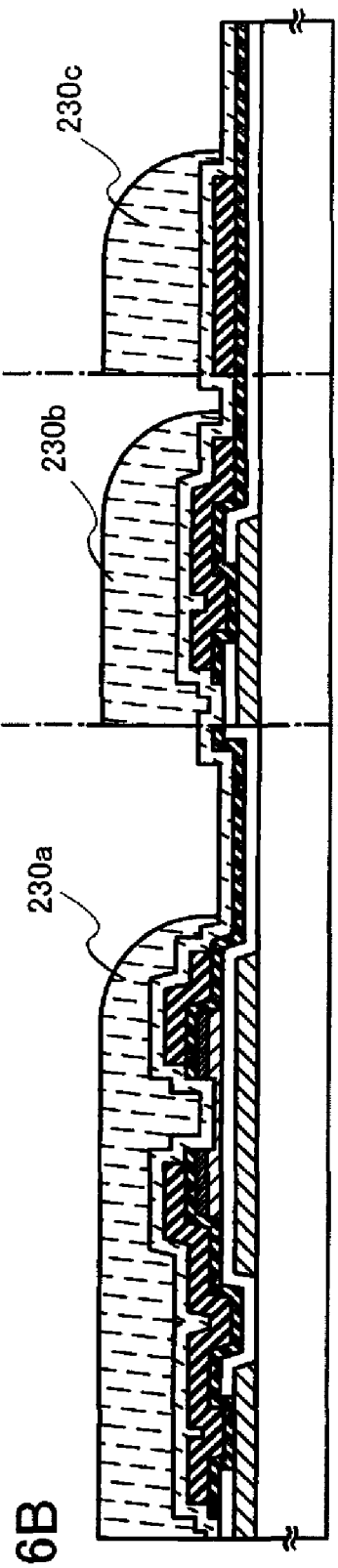

Mask layers 229a to 229c are formed over the insulating film 228 (see FIG. 6A)

As conductive layers for the gate wiring layer 203, source wiring layers 201 and 202, the conductive layers 225a and 225b, and the conductive layers 226 and 227, a conductive material having reflectivity to light is used. On the other hand, as the light-transmitting substrate 200, the light-transmitting layers 218a, 218b, 219, and 220, a material having light-transmitting property is used. In a light-exposure step to form the mask layers 229a to 229c used for an etching step of the insulating film 228 functioning as a protective film of a thin film transistor, the light-transmitting substrate is irradiated with light from the opposite side of the surface over which elements are formed (also referred to as the back side), and light exposure from the back surface can be performed using conductive layers used for the gate wiring layer 203 having reflectivity, the source wiring layers 201 and 202, the conductive layers 225a and 225b, and the conductive layers 226 and 227 as masks. Therefore, since it is not necessary to form a light-exposure mask for etching of the insulating film 228, the number of photolithography steps can be further reduced.

The shape of a mask layer formed by a photolithography step can be processed by heat treatment (also referred to as reflow treatment). In this embodiment mode, heat treatment is performed on the mask layers 229a to 229c, and mask layers 230a to 230c are formed (see FIG. 6B). Since the peripheral portions of the mask layers 229a to 229c are extended and the areas thereof are increased by heat treatment, the mask layers 230a to 230c, which can cover a lager region on the insulating film 228, can be obtained. The areas of the mask layers 230a to 230c may spread, at least, outside edge portions of the gate wiring layer 203, the source wiring layers 201 and 202, the conductive layers 225a and 225b, and the conductive layers 226 and 227. As for the mask layer 230b over the conductive layer 225b which covers the light-transmitting conductive layer 218b functioning as a pixel electrode, a condition of heat treatment is controlled because the aperture ratio is decreased due to enlargement of the area of the mask layer 230b by heat treatment.

Figure 6C:
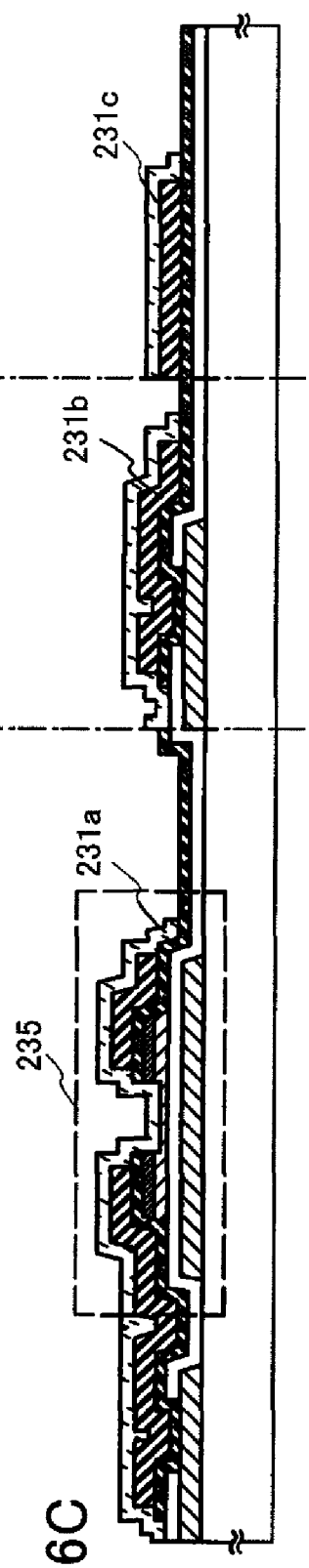

The insulating film 228 is etched using the mask layers 230a to 230c as masks, and insulating films 231a to 231c are formed (see FIG. 6C). Since the shapes of the mask layers 230a to 230c are reflected in the insulating films 231a to 231c, the insulating films 231a to 231c are formed to cover the edge portions of the gate wiring layer 203, the source wiring layers 201 and 202, the conductive layers 225a and 225b, and the conductive layers 226 and 227.

The conductive layer 225b functioning as a source or drain electrode layer and the light-transmitting conductive layer 218b functioning as a pixel electrode layer are provided to be in contact with each other without the insulating film 231a interposed therebetween, whereby parasitic capacitance generated between the source or drain electrode layer and the pixel electrode layer can be reduced. An aperture ratio can be improved by leaving the conductive layer 225b having reflectivity only over the gate wiring layer 203. Alternatively, the conductive layer 225b may be removed completely and is not to be formed necessarily. In this case, it is preferably that the gate wiring layer below a formation region of the conductive layer 225b be concealed (covered) by light-blocking film such as a black matrix. On the other hand, since the source wiring layer is formed with the gate insulating layer interposed between the source wiring layer and the pixel electrode layer, electrical failure such as a short circuit between the source wiring layer and the pixel electrode layer due to a defective shape, even when the source wiring layer is designed to be minute.

By the above-described steps, a thin film transistor 235, which is an inverted staggered thin film transistor with a channel-etched structure, is formed (see FIG. 6C and FIG. 2A). In the cross sectional views taken along the lines Y-Y' and Z-Z' that illustrate terminal portions, the light-transmitting conducive layers 219 and 220 are exposed. The exposed light-transmitting conductive layers 219 and 220 can be electrically connected to an external driver circuit via a conductive adhesive material such as an anisotropic conductive film.

A liquid crystal element is formed to be in contact with an exposed region of the light-transmitting conductive layer 218b functioning as a pixel electrode layer, whereby the thin film transistor 235 and the liquid crystal element can be electrically connected to each other. For example, an alignment film is formed over the light-transmitting conductive layer 218b, a counter electrode which is provided with another alignment film in a similar manner is made to face the alignment film over the light-transmitting conductive layer 218b, and thus a liquid crystal layer may be formed between the alignment films. In this embodiment mode, only the light-transmitting conductive layer 218b is used for the pixel electrode layer, whereby a transmissive liquid crystal display device can be manufactured.

As described above, according to this embodiment mode, the photolithography process can be simplified by reducing the number of light-exposure masks, whereby a display device with high reliability can be manufactured at low cost with high productivity.

In the present invention, the display device includes a display element. As described in this embodiment mode, the liquid crystal element (liquid crystal display element) is suitably used as the display element. Further, a light-emitting element (EL element), in which a layer including an organic substance, an inorganic substance, or a compound thereof that perform light-emission referred to as electroluminescence (hereinafter, also referred to as "EL") is interposed between electrodes, may be used. In addition, a display medium whose contrast is changed by an electric effect, such as an electronic ink, can be used. Note that a display device using the EL element refers to an EL display, and a display using a liquid crystal element refers to a liquid crystal display, a transmissive liquid crystal display, a semi-transmissive liquid crystal display. A display device using electronic ink refers to an electronic paper.

In addition, the display device includes a panel where a display element is sealed and a module where an IC such as a controller or the like is mounted on the panel. Further, the present invention relates to an element substrate that is one mode before a display element is completed in a manufacturing process of the display device. The element substrate is provided with a means to supply current to the display element in each of plural pixels. As for the element substrate, specifically, only a pixel electrode layer of the display element is formed, or a conductive film to be a pixel electrode layer has been deposited and the conductive film is not etched yet to form a pixel electrode layer. Alternatively, any other mode may be applied to the element substrate.

Note that a display device in this specification refers to an image display device, a display device, or a light source (including a lighting device). Further, the display device includes any of the following modules in its category: a module including a connector such as an flexible printed circuit (FPC), tape automated bonding (TAB) tape, or a tape carrier package (TCP); a module having TAB tape or a TCP which is provided with a printed wiring board at the end thereof; and a module having an integrated circuit (IC) which is directly mounted on a display element by a chip on glass (COG) method.

Embodiment Mode 2

In this embodiment mode, an example of a thin film transistor whose shape is different from that of Embodiment Mode 1 will be described. Except the shape, the thin film transistor can be formed in a similar manner to Embodiment Mode 1; thus, repetitive description of the same components or components having similar functions as in Embodiment Mode 1 and a manufacturing process for forming those components will be omitted.

Figure 8:
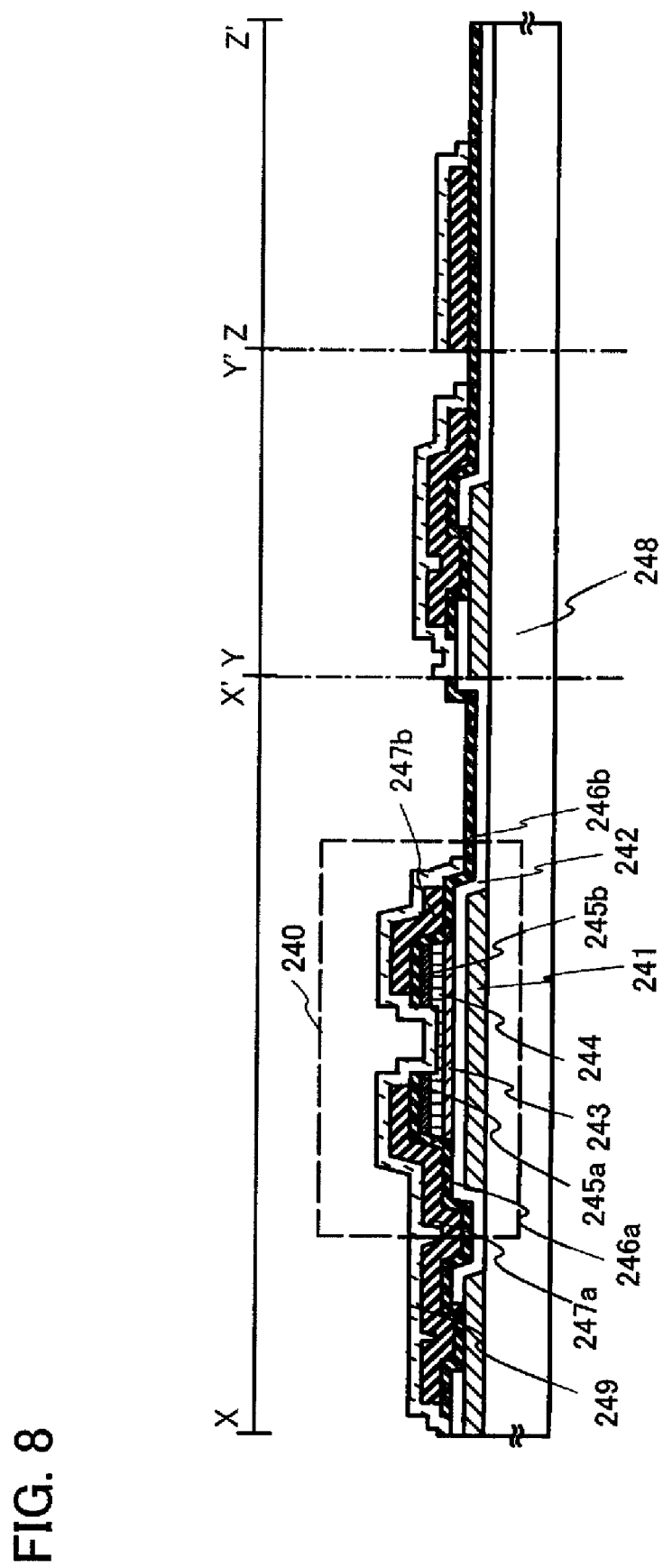
FIG. 8 is a view illustrating a display device of the present invention.

A thin film transistor 240 of this embodiment mode, which is an inversed staggered thin film transistor with a channel-etched structure, is shown in FIG. 8.

In FIG. 8, over a substrate 248a, thin film transistor 240 is provided, which includes a gate electrode layer 241, a gate insulating layer 242, a semiconductor layer 243, which is a microcrystalline semiconductor film, a buffer layer 244, source or drain regions 245a and 245b, light-transmitting conductive layers 246a and 246b, and conductive layers 247a and 247b. An insulating film 249 is provided to cover the thin film transistor 240. A stacked layer of the light-transmitting layer 246a and the conductive layer 247a, and a stacked layer of the light-transmitting conductive layer 246b and the conductive layer 247b function as source and drain electrodes. Further, the light-transmitting conductive layer 246b, which is exposed from the insulating film 249, functions as a pixel electrode layer.

In this embodiment mode, a microcrystalline semiconductor film is used for the semiconductor layer 243, and the buffer layer 244 is formed between the semiconductor layer 243 and the source or drain regions 245a and 245b.

The buffer layer 244 is provided over the semiconductor layer 243, whereby damage to the semiconductor layer 243, which is caused in manufacturing process (reduction in film thickness due to radical by plasma or etchant in etching, oxidation, or the like), can be prevented. Therefore, reliability of the thin film transistor 240 can be improved.

The microcrystalline semiconductor film used for the semiconductor layer 243 may be formed over a surface of the gate insulating layer 242 while being (or which has been) subjected to by hydrogen plasma. The microcrystalline semiconductor film is formed over the gate insulating layer, which has been subjected to hydrogen plasma; thus, the crystal growth of a microcrystal can be promoted. In addition, lattice distortion at an interface of the gate insulating layer and the microcrystalline semiconductor film can be reduced, and interface characteristics of the gate insulating layer and the microcrystalline semiconductor film can be improved. Therefore, the resulting microcrystalline semiconductor film can have a high electrical characteristics and high reliability.

The gate insulating layer, the microcrystalline semiconductor film, the buffer layer, and the semiconductor film to which an impurity imparting one conductivity type is added and which forms the source and drain regions may be formed in one reaction chamber, or different reaction chambers according to the kind of each film.

Before a substrate is carried into a reaction chamber to perform film formation, it is preferable to perform cleaning, flush (washing) treatment (hydrogen flush using hydrogen as a flush substance, silane flush using silane as a flush substance, or the like), and coating by which the inner wall of each reaction chamber is coated with a protective film (the coating is also referred to as pre-coating treatment). Pre-coating treatment is treatment in which plasma treatment is performed by flowing of a deposition gas in a reaction chamber to coat the inner wall of the reaction chamber with a thin protective film which is a film to be formed, in advance. By the flush treatment and the pre-coating treatment, a film to be formed can be prevented from being contaminated by an impurity element such as oxygen, nitrogen, or fluorine in the reaction chamber.

Note that the gate insulating layer, the microcrystalline semiconductor film, the buffer layer, and the semiconductor film to which an impurity imparting one conductivity type is added and which forms the source and drain regions, may be formed successively without being exposed to the atmosphere. By forming successively the gate insulating layer, the microcrystalline semiconductor film, the buffer layer, and the semiconductor film to which an impurity imparting one conductivity type is added without being exposed to the atmosphere, each interface between stacked layers can be formed without being contaminated by an atmospheric constituent or a contaminant impurity floating in the atmosphere. Thus, variation in characteristics of thin film transistors can be reduced.

As an example of a three-layer structure of the gate insulating layer 242, a silicon nitride film or a silicon nitride oxide film may be formed as a first layer over the gate electrode layer 241, a silicon oxynitride film may be formed as a second layer, a silicon nitride film may be formed as a third layer, and the microcrystalline semiconductor film may be formed over the silicon nitride film that is a top layer. In this case, the silicon nitride film or the silicon nitride oxide film as the first layer is preferably thicker than 50 nm and has an effect as a barrier which blocks an impurity element such as sodium, an effect of preventing a hillock of the gate electrode, an effect of preventing oxidation of the gate electrode, and the like. The film thickness of the silicon oxynitride film as the second layer is preferably adequate thickness from an interface of the microcrystalline semiconductor film. The silicon nitride film as the third layer has an effect of improving adhesion of the microcrystalline semiconductor film and an effect of preventing oxidation in LP treatment in which the microcrystalline semiconductor film is irradiated with a laser beam.

By forming an ultrathin nitride film, such as a silicon nitride film, over the surface of the gate insulating layer in this manner, adhesion of the microcrystalline semiconductor film can be improved. The nitride film may be formed by a plasma CVD method, or by nitridation treatment by treatment with plasma which is generated by microwaves and has high density and low temperature. In addition, the silicon nitride film or the silicon nitride oxide film may also be formed when a reaction chamber is subjected to silane flush treatment.

A microcrystalline semiconductor film exhibits weak n-type conductivity when an impurity element for valence electron control is not intentionally added. Thus, threshold control of the microcrystalline semiconductor film, which functions as a channel formation region of a thin film transistor, can be achieved by addition of an impurity element which imparts p-type conductivity at the same time as or after the film formation. A typical example of an impurity element which imparts p-type conductivity is boron, and an impurity gas such as $B_2H_6$ or $BF_3$ may be mixed into silicon hydride at a ratio of 1 ppm to 1000 ppm, preferably, 1 ppm to 100 ppm. A concentration of boron is preferably set to be $1\times10^{14}$ atoms/$cm^3$ to $6\times10^{16}$ atoms/$cm^3$. Further, phosphorus, which is impurity element imparting n-type conductivity, may be included in the microcrystalline semiconductor film.

The microcrystalline semiconductor film is a film including a semiconductor having an intermediate structure between amorphous and crystalline (including single crystal and polycrystalline) structures. This semiconductor is a semiconductor which has a third state that is stable in terms of free energy, and is a crystalline semiconductor in which short-range order and lattice distortion are included, and in which column-like or needle-like crystals, seen from the film surface, with a grain size of 0.5 nm to 20 nm are grown in a normal direction with respect to a surface of the substrate. Further, a microcrystalline semiconductor and a non-single-crystal semiconductor are mixed therein. Microcrystalline silicon, which is a typical example of a microcrystalline semiconductor, has a Raman spectrum, which is shifted to a wave number side lower than 521 $cm^{-1}$ that represents single crystal silicon. That is, the peak of a Raman spectrum of the microcrystalline silicon is within the range from 480 $cm^{-1}$ which represents amorphous silicon, to 521 $cm^{-1}$ which represents single crystal silicon. Further, microcrystalline silicon includes hydrogen or halogen of at least 1 at. % or more for termination of dangling bonds. Moreover, by inclusion of a rare gas element such as helium, argon, krypton, or neon to enhance lattice distortion further, whereby stability is increased and a favorable microcrystalline semiconductor film can be obtained. Such description about the microcrystalline semiconductor film is disclosed in, for example, U.S. Pat. No. 4,409,134.

The microcrystalline semiconductor film can be formed by a high-frequency plasma CVD method with a frequency of several tens to several hundreds of MHz or a microwave plasma CVD apparatus with a frequency greater than or equal to 1 GHz. The microcrystalline semiconductor film can be typically formed using a dilution of silicon hydride such as $SiH_4$, $Si_2H_6$, $SiH_2Cl_2$, $SiHCl_3$, $SiCl_4$, or $SiF_4$ with hydrogen. With a dilution with one or plural kinds of rare gas elements selected from helium, argon, krypton, and neon in addition to silicon hydride and hydrogen, the microcrystalline semiconductor film can be formed. The flow rate ratio of hydrogen to silicon hydride at this time is set to be 5:1 to 200:1, preferably 50:1 to 150:1, more preferably 100:1.

Preferably, the microcrystalline semiconductor film includes oxygen at a concentration of less than or equal to $5\times10^{19}$ atoms/$cm^3$, more preferably less than or equal to $1\times10^{19}$ atoms/$cm^3$. Further, the microcrystalline semiconductor film preferably includes nitrogen and carbon each at a concentration of less than or equal to $1\times10^{18}$ atoms/$cm^3$. By decreasing concentrations of oxygen, nitrogen, and carbon mixed into the microcrystalline semiconductor film, the microcrystalline semiconductor film can be prevented from being changed into an n-type.

The microcrystalline semiconductor film is formed with a thickness of more than 0 nm and less than or equal to 50 nm, preferably more than 0 nm and less than or equal to 20 nm.

The microcrystalline semiconductor film functions as a channel formation region of a thin film transistor which is to be formed later. By setting the thickness of the microcrystalline semiconductor film in the above-described range, the thin film transistor which is to be formed later becomes fully-depleted. Furthermore, since the microcrystalline semiconductor film is formed of microcrystals, the microcrystalline semiconductor film has a lower resistance than an amorphous semiconductor film. Therefore, a thin film transistor using the microcrystalline semiconductor film has current-voltage characteristics represented by a curve with a steep slope in a rising portion, has an excellent response as a switching element, and can be operated at high speed. When the microcrystalline semiconductor film is used for the channel formation region of the thin film transistor, fluctuation in the threshold voltage of the thin film transistors can be suppressed. Therefore, a display device with less variation in electrical characteristics can be manufactured.

The microcrystalline semiconductor film has higher mobility than an amorphous semiconductor film. Thus, when the thin film transistor whose channel formation region is formed using the microcrystalline semiconductor film is used for a switching of a display element, the area of the channel formation region, that is, the area of the thin film transistor can be reduced. Accordingly, the area of the thin film transistor per pixel is reduced, and thus the aperture ratio of the pixel can be increased. As a result, a device with high resolution can be manufactured.

In addition, the microcrystalline semiconductor film has needle-like crystals, which have grown longitudinally from the lower side. An amorphous structure and a crystalline structure are mixed in the microcrystalline semiconductor film, and a crack is easily generated between a crystal region and an amorphous region due to local stress. Thus, a gap is easily generated. A new radical is interposed into this gap in some cases, which causes crystal growth. However, since the upper crystal plane is larger, a crystal is likely to grow upward into a needle shape. Even if the microcrystalline semiconductor film grows longitudinally as described above, the growth rate is a tenth to a hundredth of the film-formation rate of an amorphous semiconductor film.

The buffer layer can be formed by a plasma CVD method using a silicon gas (a silicon hydride gas or a silicon halide gas) such as $SiH_4$, $Si_2H_6$, $SiH_2Cl_2$, $SiHCl_3$, $SiCl_4$, or $SiF_4$. Alternatively, by a dilution of silane described above with one or plural kinds of rare gas elements selected from helium, argon, krypton, and neon, an amorphous semiconductor film can be formed. An amorphous semiconductor film can be formed using hydrogen with a flow rate of greater than or equal to 1 time and less than or equal to 20 times, preferably greater than or equal to 1 time and less than or equal to 5 times as high as that of silicon hydride. In addition, an amorphous semiconductor film including nitrogen can be formed using the silicon hydride, and nitrogen or ammonia. With the use of the silicon hydride and a gas containing fluorine, chlorine, bromine, or iodine ($F_2$, $Cl_2$, $Br_2$, $I_2$, HF, HCl, HBr, HI, or the like), an amorphous semiconductor film containing fluorine, chlorine, bromine, or iodine can be formed.

Alternatively, as the buffer layer, an amorphous semiconductor film can be formed by sputtering with hydrogen or a rare gas using an amorphous semiconductor as a target. In this case, by inclusion of ammonia, nitrogen, or $N_2O$ in an atmosphere, an amorphous semiconductor film including nitrogen can be formed. Further, by inclusion of a gas including fluorine, chlorine, bromine, or iodine ($F_2$, $Cl_2$, $Br_2$, $I_2$, HF, HCl, HBr, HI, or the like) in an atmosphere, an amorphous semiconductor film including fluorine, chlorine, bromine, or iodine can be formed.

Still further, as the buffer layer, an amorphous semiconductor film is formed on a surface of the microcrystalline semiconductor film by a plasma CVD method or a sputtering method, and then by hydrogenation, nitridation, or halogenation of the surface of the amorphous semiconductor film through processing of the surface of the amorphous semiconductor film with hydrogen plasma, nitrogen plasma, halogen plasma, or plasma of a rare gas (helium, argon, krypton, or neon).

The buffer layer is preferably formed of an amorphous semiconductor film. Therefore, when the buffer layer is formed by a high-frequency plasma CVD method with a frequency of several tens to several hundreds of MHz, or a microwave plasma CVD method, it is preferable to control the film deposition condition so that an amorphous semiconductor film can be formed.

Typically, the buffer layer is preferably formed with a thickness of greater than or equal to 10 nm and less than or equal to 50 nm. In addition, the total concentration of nitrogen, carbon, and oxygen included in the buffer layer is preferably set to be $1 \times 10^{20}$ atoms/cm$^3$ to $15 \times 10^{20}$ atoms/cm$^3$. With this concentration, the buffer layer with a thickness of grater than or equal to 10 nm and less than or equal to 50 nm can also function as a high-resistance region.

Alternatively, the buffer layer may be formed to have a thickness of greater than or equal to 150 nm and less than or equal to 200 nm, and each concentration of carbon, nitrogen, and oxygen included in the buffer layer may be set to be less than or equal to $3 \times 10^{19}$ atoms/cm$^3$, preferably, less than or equal to $5 \times 10^{18}$ atoms/cm$^3$.

By forming an amorphous semiconductor film or an amorphous semiconductor film including hydrogen, nitrogen, or halogen over the surface of the microcrystalline semiconductor film, as a buffer layer, the surfaces of crystal grains included in the microcrystalline semiconductor film can be prevented from being naturally oxidized. That is, by formation of the buffer layer over the surface of the microcrystalline semiconductor film, the microcrystal grains can be prevented from being oxidized. Since the buffer layer includes hydrogen and/or fluorine, oxygen can be prevented from entering the microcrystalline semiconductor film.

The buffer layer is formed using an amorphous semiconductor film or an amorphous semiconductor film including hydrogen, nitrogen, or halogen, whereby the buffer layer has higher resistance than the microcrystalline semiconductor film which functions as a channel formation region. Therefore, in a thin film transistor to be formed later, the buffer layer formed between the source and drain regions and the microcrystalline semiconductor film functions as a high-resistant region. Accordingly, the off current of the thin film transistor can be reduced. When the thin film transistor is used as a switching element of a display device, the contrast of the display device can be improved.

Edge portions of the semiconductor layer, the buffer layer, and source and drain regions are etched to have tapered shapes, so that the source and drain regions, which are semiconductor films to which an impurity imparting one conductivity type is added, and the semiconductor layer can be prevented from being in contact with each other directly. The tapered angle of the edge potions are set to be 30° to 90°, preferably 45° to 80°. Therefore, the distance between the source and drain regions and the semiconductor layer are increased, so that leakage current can be prevented. Further, disconnection of a wiring due to a step shape can be prevented.

A buffer layer below the source and drain regions and a buffer layer over the channel formation region of the semiconductor layer are a continuous film formed at the same time using the same material. The buffer layer over the semiconductor layer blocks external air and an etching residue and protects the semiconductor layer with hydrogen included in the buffer layer.

The buffer layer which does not include an impurity imparting one conductivity type is provided, whereby the impurity imparting one conductivity type, which is included in the source and drain regions, and an impurity imparting one conductivity type, which is used for controlling threshold voltage of the semiconductor layer which is the microcrystalline semiconductor film, can be prevented from being mixed with each other. When the impurities imparting one conductivity type are mixed with each other, a recombination center is generated, which leads to flow of leakage current and loss of the effect of reducing off current.

By provision of the buffer layer as described above, a thin film transistor with high withstand voltage, in which leakage current is reduced, can be manufactured. Accordingly, the thin film transistor has high reliability and can be suitably used for a liquid crystal display device where a voltage of 15 V is applied.

By forming the channel formation region using the microcrystalline semiconductor film, a field-effect mobility of 1 cm$^2$/V·sec to 20 cm$^2$/V·sec can be obtained. Accordingly, this thin film transistor can be used as a switching element of a pixel in a pixel portion and as an element included in a scan line (gate line) driver circuit.

According to this embodiment mode, a display device including a thin film transistor with excellent electrical characteristics and high reliability can be manufactured. Further, by reducing the number of light-exposure masks, a photolithography process is simplified, whereby a display device with high reliability can be manufactured at low cost with high productivity.

Embodiment Mode 3

In this embodiment mode, an example of a manufacturing process of Embodiment Mode 2, in which a microcrystalline semiconductor film is irradiated with a laser beam, will be described.

A gate electrode layer is formed over a light-transmitting substrate, and a gate insulating layer is formed to cover the gate electrode layer. Then, a microcrystalline silicon (SAS) film is deposited over the gate insulating layer as a microcrystalline semiconductor film. The thickness of the microcrystalline semiconductor film may be greater than or equal to 1 nm and less than 15 nm, preferably greater than or equal to 2 nm and less than or equal to 10 nm. In particular, since the microcrystalline semiconductor film with a thickness of 5 nm (4 nm to 8 nm) has high absorptance with respect to a laser beam, productivity is improved.

In the case where the microcrystalline semiconductor film is formed over the gate insulating layer by a plasma CVD method or the like, a region which includes more amorphous components than the semiconductor film which includes crystals (here, referred to as an interface region) is formed near the interface between the gate insulating layer and a semiconductor film which includes crystals, in some cases. In addition, in the case where an ultrathin microcrystalline semiconductor film with a thickness of about 10 nm or less is formed by a plasma CVD method or the like, although a semiconductor film which includes microcrystal grains can be formed, it is difficult to obtain a semiconductor film which includes microcrystal grains with high quality uniformly throughout the film. In these cases, a laser process for irradiation with a laser beam to be described below is effective.

Next, a surface of a microcrystalline silicon film is irradiated with a laser beam having such a density that the microcrystalline silicon film is not melted. That is, this laser process (hereinafter, also referred to as "LP") of this embodiment mode involves solid-phase crystal growth which is performed by radiation heating without the microcrystalline silicon film being melted. In other words, the process utilizes a critical region where a deposited microcrystalline silicon film is not brought into a liquid phase, and in that sense, the process also can be referred to as "critical growth".

The laser beam can have influence on the interface between the microcrystalline silicon film and the gate insulating layer. Accordingly, using the crystals on the surface side of the microcrystalline silicon film as nuclei, solid-phase crystal growth advances from the surface toward the interface with the gate insulating layer, and roughly column-like crystals grow. The solid-phase crystal growth by the LP is not to increase the size of crystal grains but rather to improve crystallinity in a film thickness direction.

In the LP, for example, a microcrystalline silicon film over a glass substrate of 730 mm×920 mm can be processed with a single laser beam scan, by collecting a laser beam into a long rectangular shape (a linear laser beam). In this case, the proportion of overlap of linear laser beams (the overlap rate) is set to be 0% to 90% (preferably, 0% to 67%). Accordingly, the length of processing time for each substrate can be shortened, and productivity can be improved. The shape of the laser beam is not limited to a linear shape, and similar.processing can be conducted using a planar laser beam. In addition, the LP of this embodiment mode is not limited to the use for the glass substrate of the above-described size and can be applied to substrates of various sizes.

The LP has effects of improving crystallinity of an interface region with the gate insulating layer and improving electrical characteristics of a thin film transistor having a bottom gate structure like the thin film transistor of this embodiment mode.

In such critical growth, there is also a feature in that unevenness (a projection called a ridge), which is observed on a surface of conventional low-temperature polysilicon, is not formed and the smoothness of a silicon surface is maintained after the LP.

A crystalline silicon film that is obtained by the action of the laser beam directly on the microcrystalline silicon film as deposited in this embodiment mode is distinctly different in growth mechanism and film quality from a conventional microcrystalline silicon film as deposited and a microcrystalline silicon film which is modified by conduction heating. In this specification, a crystalline semiconductor film that is obtained by performing LP on a microcrystalline semiconductor film as deposited is referred to as an LPSAS film.

After the microcrystalline semiconductor film such as an LPSAS film is formed, an amorphous silicon (a-Si:H) film is formed as a buffer layer by a plasma CVD method at 300° C. to 400° C. By formation of the amorphous silicon film, hydrogen is supplied to the LPSAS film, and the same effect as in the case of hydrogenation of the LPSAS film can be achieved. In other words, by depositing the amorphous silicon film over the LPSAS film, hydrogen is diffused into the LPSAS film, so that a dangling bond can be terminated.

In the following process, a display device including a thin film transistor is manufactured in similar manner to that in Embodiment Mode 1.

This embodiment mode can be combined with Embodiment Mode 2 as appropriate.

Embodiment Mode 4

Next, a structure of a display panel, which is one mode of a display device in the present invention, will be described below. As a display device of this embodiment mode, a liquid crystal panel, which is one mode of a liquid crystal display device including a liquid crystal element, will be described.

Figure 9A:
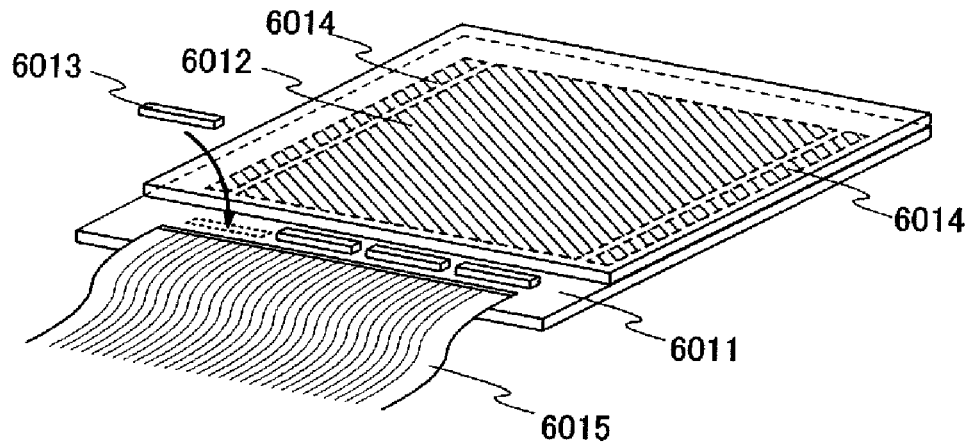
FIGS. 9A to 9C are views illustrating display devices of the present invention.
Figure 9B:
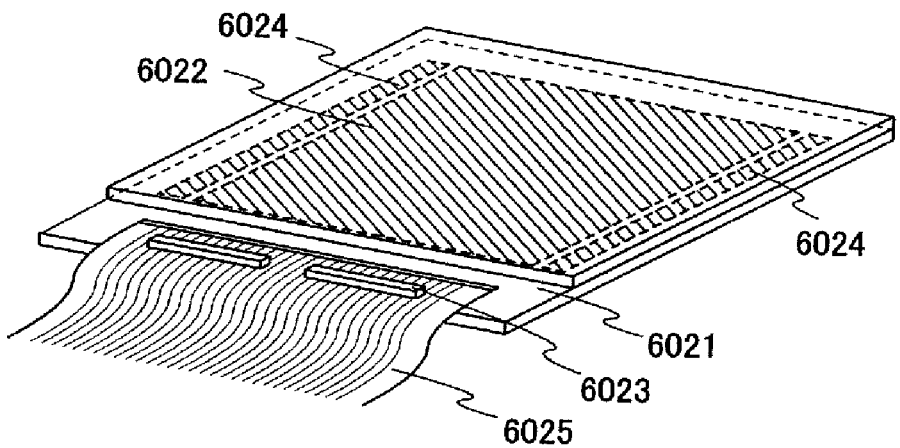
Figure 9C:
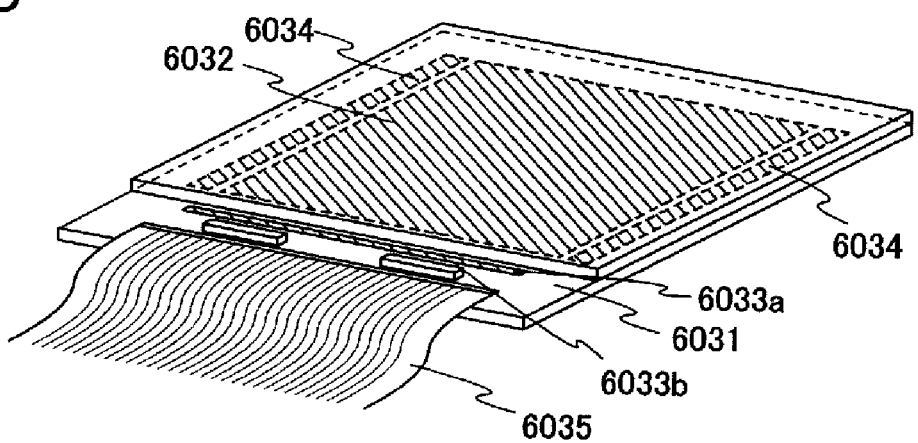

FIG. 9A to 9C show a mode of a display panel in which a signal line driver circuit 6013, which is separately formed, is connected to a pixel portion 6012 formed over a substrate 6011. In this embodiment mode, the pixel portion 6012 and a scan line driver circuit 6014 are each formed using a thin film transistor in which a microcrystalline semiconductor film is used. When the signal line driver circuit is formed using a transistor which has higher field-effect mobility compared to the thin film transistor using the microcrystalline semiconductor film, an operation of the signal line driver circuit which demands higher driving frequency than that of the scan line driver circuit can be stabilized. Note that the signal line driver circuit 6013 may be formed with the use of a transistor using a single crystal semiconductor, a thin film transistor using a polycrystalline semiconductor, or a transistor using SOI. The pixel portion 6012, the signal line driver circuit 6013, and the scan line driver circuit 6014 are each supplied with potential of a power source, a variety of signals, and the like via an FPC 6015.

Note that both the signal line driver circuit and the scan line driver circuit may be formed over the same substrate as that of the pixel portion.

Also, when a driver circuit is separately formed, a substrate provided with the driver circuit is not always required to be attached to a substrate provided with the pixel portion, and may be attached to, for example, the FPC. FIG. 9B shows a mode of a display panel, in which only a signal line driver circuit 6023 is separately formed and connected to a pixel portion 6022 and a scan line driver circuit 6024 formed over a substrate 6021. In this embodiment mode, the pixel portion 6022 and the scan line driver circuit 6024 are each formed with the use of a thin film transistor using a microcrystalline semiconductor film. The signal line driver circuit 6023 is connected to the pixel portion 6022 via an FPC 6025. The pixel portion 6022, the signal line driver circuit 6023, and the scan line driver circuit 6024 are each supplied with potential of a power source, a variety of signals, and the like via the FPC 6025.

Alternatively, only part of a signal line driver circuit or part of a scan line driver circuit may be formed over the same substrate as that of a pixel portion by using a thin film transistor in which a microcrystalline semiconductor film is used, and the other part of the driver circuit may be separately formed and electrically connected to the pixel portion. FIG. 9C shows a mode of a display panel in which an analog switch 6033a included in a signal line driver circuit is formed over a substrate 6031, over which a pixel portion 6032 and a scan line driver circuit 6034 are formed, and a shift register 6033b included in the signal line driver circuit is formed separately over a different substrate and then attached to the substrate 6031. In this embodiment mode, the pixel portion 6032 and the scan line driver circuit 6034 are each formed with the use of a thin film transistor using a microcrystalline semiconductor film. The shift resistor 6033b included in the signal line driver circuit is connected to the pixel portion 6032 via an FPC 6035. The pixel portion 6032, the signal line driver circuit, and the scan line driver circuit 6034 are each supplied with a potential of a power source, a variety of signals, and the like via the FPC 6035.

As shown in FIGS. 9A to 9C, in the display device of the present invention, all or part of the driver circuit can be formed over the same substrate as that of a pixel portion with the use of the thin film transistor using a microcrystalline semiconductor film.

Note that there is no particular limitation on a connection method of the substrate formed separately, and a known COG method, a wire bonding method, a TAB method, or the like can be used. Further, a connection position is not limited to the position shown in FIGS. 9A to 9C, as long as electrical connection is possible. Alternatively, a controller, a CPU, a memory, and/or the like may be formed separately and connected.

Note that the signal line driver circuit used in the present invention is not limited to a mode including only a shift register and an analog switch. In addition to the shift register and the analog switch, another circuit such as a buffer, a level shifter, or a source follower may be included. Moreover, the shift register and the analog switch are not necessarily provided. For example, a different circuit such as a decoder circuit by which a signal line can be selected may be used instead of the shift register, or a latch or the like may be used instead of the analog switch.

Figure 10A:
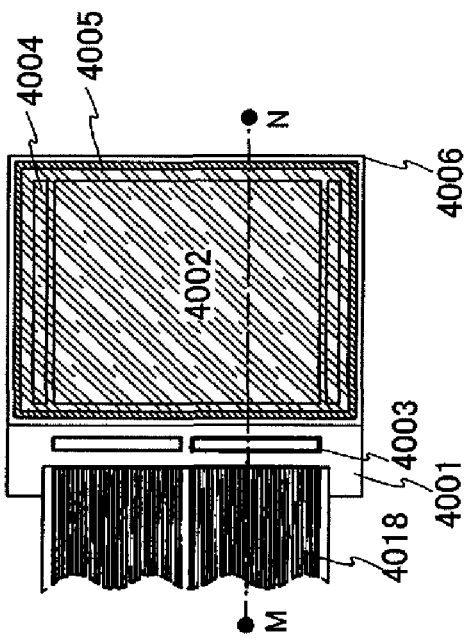
FIGS. 10A and 10B are views illustrating a display device of the present invention.
Figure 10B:
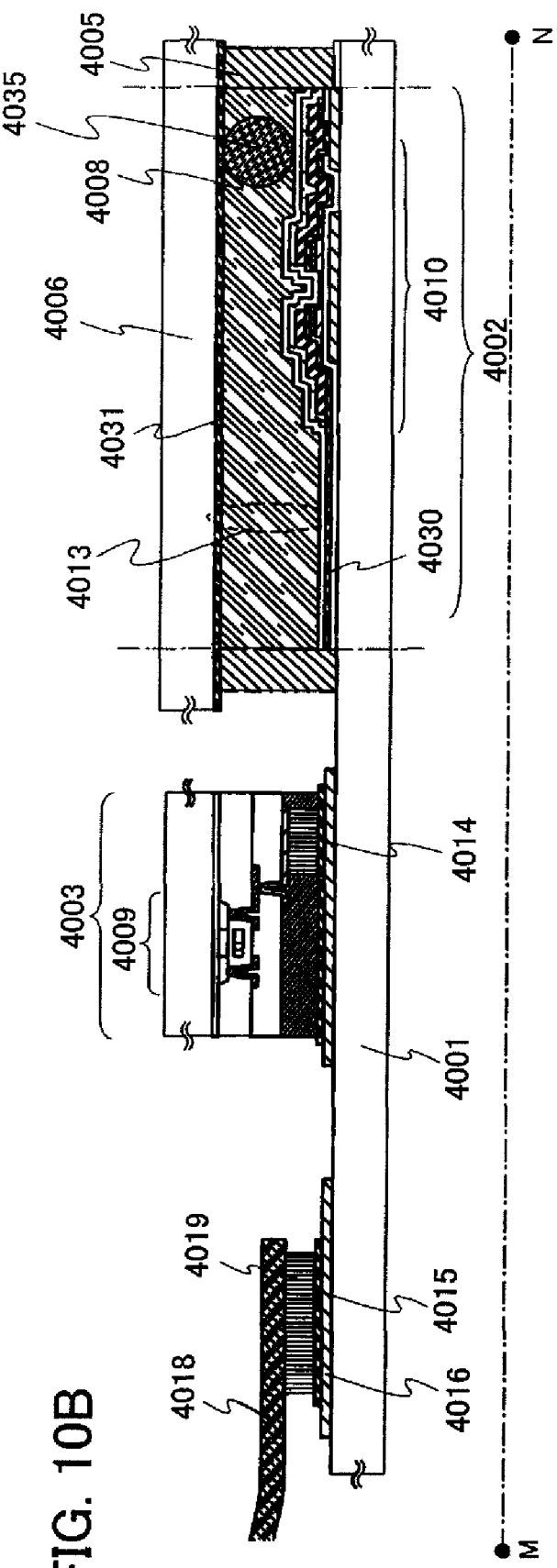

Next, an external view and a cross section view of a display panel, which is one mode of the display device of the present invention, will be described with reference to FIGS. 10A and 10B. FIG. 10A is a top plan view of a panel. In the panel, a thin film transistor 4010 and a liquid crystal element 4013, which are formed over a first substrate 4001, are sealed between the first substrate 4001 and a second substrate 4006 by a sealant 4005. FIG. 10B corresponds to a cross sectional view taken along a line M-N in FIG. 10A.

The sealant 4005 is provided to surround the pixel portion 4002 and the scan line driver circuit 4004, which are provided over the first substrate 4001. The second substrate 4006 is provided over the pixel portion 4002 and the scan line driver circuit 4004. Accordingly, the pixel portion 4002 and the scan line driver circuit 4004 are sealed together with liquid crystal 4008 by the first substrate 4001, the sealant 4005, and the second substrate 4006. A signal line driver circuit 4003, which formed over a substrate prepared separately using a polycrystalline semiconductor film, is mounted at a region different from the region surrounded by the sealant 4005 over the first substrate 4001. In this embodiment mode, an example of attaching the signal line driver circuit including a thin film transistor formed using a polycrystalline semiconductor film to the first substrate 4001 will be described. Alternatively, a signal line driver circuit including a thin film transistor, which is formed using a single crystal semiconductor, may be attached to the first substrate 4001. In FIGS. 10A and 10B, a thin film transistor 4009, which is formed using a polycrystalline semiconductor film and included in the signal line driver circuit 4003 will be illustrated as an example.

Further, the pixel portion 4002 and the scan line driver circuit 4004, which are formed over the first substrate 4001, each include a plurality of thin film transistors. The thin film transistor 4010 included in the pixel portion 4002 is illustrated in FIG. 10B. The thin film transistor 4010 corresponds to the thin film transistor shown in Embodiment Mode 1, which can be formed through the same manufacturing process shown in Embodiment Modes 1.

The liquid crystal element 4013 and the thin film transistor 4010 are connected to each other by a light-transmitting conductive layer 4030 functioning as a pixel electrode layer. A counter electrode 4031 of the liquid crystal element 4013 is formed over the second substrate 4006. A part in which the light-transmitting conductive layer 4030, the counter electrode 4031, and the liquid crystal 4008 are overlapped corresponds to the liquid crystal element 4013.

Note that as the first substrate 4001 and the second substrate 4006, glass, ceramics, or plastics can be used. As for plastic, an FRP (fiberglass-reinforced plastics) plate, a PVF (polyvinyl fluoride) film, a polyester film, or an acrylic resin film can be used. In the case of a transmissive liquid crystal display device, the first and second substrates are needed to have a light transmitting property. However, in the case of a semi-transmitting liquid display device, a reflective material may be used for a part which corresponds to a reflective region.

A spherical spacer 4035 is provided to control a distance (a cell gap) between the light-transmitting conductive layer 4030 and the counter electrode 4031. Note that a spacer which is obtained by selectively etching of an insulating film may also be used.

A variety of signals and a potential, which are supplied to the signal line driver circuit 4003 separately formed, the scan line driver circuit 4004, and the pixel portion 4002, are supplied from an FPC 4018 via wirings 4014 and 4015.

In this embodiment mode, a connecting terminal 4016 is formed of the same conductive film as that of the light-transmitting conductive layer 4030 included in the liquid crystal element 4013. In addition, the wirings 4014 and 4015 are formed of the same conductive film as that of the pixel electrode 4030.

The connection terminal 4016 is electrically connected to a terminal of an FPC 4018 via an anisotropic conductive film 4019.

Note that, although not shown, the liquid crystal display device shown in this embodiment mode includes an alignment film in the second substrate 4006 side, and includes polarizing films in the first substrate 4001 side and the second substrate 4006 side. Further, a color filter or a shielding film may be included.

Note that FIGS. 10A and 10B show an example in which the signal line driver circuit 4003 is formed separately and mounted on the first substrate 4001, but this embodiment mode is not limited to this structure. The scan line driver circuit may be separately formed and mounted on the substrate, or only part of the signal line driver circuit or part of the scan line driver circuit may be separately formed and mounted on a substrate.

This embodiment mode can be combined with any structure disclosed in other embodiment modes, as appropriate.

According to this embodiment mode using the present invention, a photolithography process is simplified by reducing the number of light-exposure masks, whereby a display device with high reliability can be manufactured at low cost with high productivity.

Embodiment Mode 5

A display device or the like obtained by the present invention can be used for a display module. That is, the present invention can be implemented in all types of electronic devices in which the display module is incorporated into a display portion.

As those kinds of electronic devices, cameras such as video cameras and digital cameras; head-mounted displays (goggle type displays); car navigation systems; projectors; car stereos; personal computers; portable information terminals (such as mobile computers, mobile phones, and electronic book readers); and the like can be given. FIGS. 11A to 11D show examples of such electronic devices.

Figure 11A:
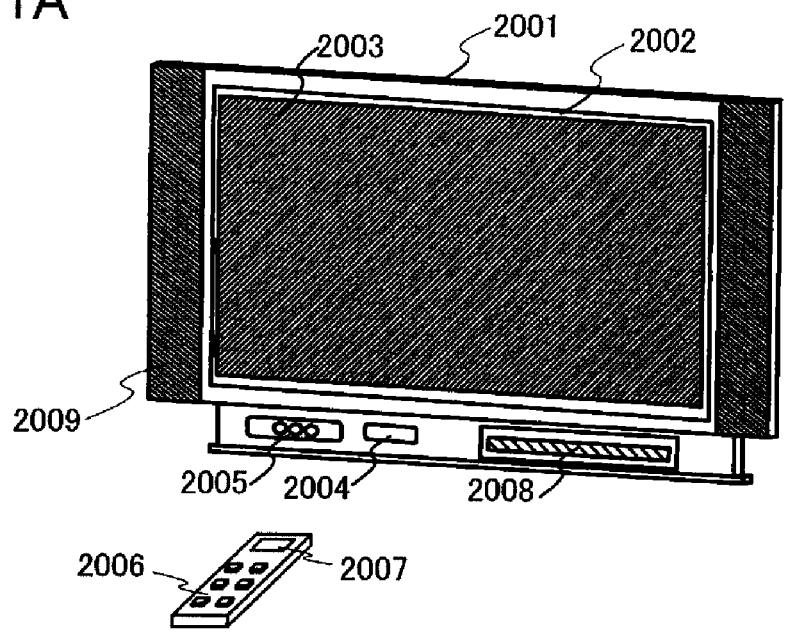
FIGS. 11A to 11D are figures showing electronic devices to which the present invention is applied.

FIG. 11A shows a television device. The television device can be completed by incorporating a display module into a housing as shown in FIG. 11A. A display panel at the stage after an FPC is attached is also referred to as a display module. A main screen 2003 is formed using the display module, and a speaker portion 2009, operation switches, and the like are provided as its accessory equipment. In such a manner, the television device can be completed.

As shown in FIG. 11A, a display panel 2002 using a display element is incorporated into a housing 2001. The television device can receive general TV broadcast by a receiver 2005, and can be connected to a wired or wireless communication network via a modem 2004, so that one-way (from a sender to a receiver) or two-way (between a sender and a receiver or between receivers) information communication can be performed. Operations of the television device can be performed using switches that are incorporated into the housing or by a remote control device 2006 provided separately, and a display portion 2007 that displays information output to this remote control device may be provided for the remote control device 2006. The display device described in the above-described embodiment mode is applied to the display panel 2002, whereby reduction in cost and enhancement of mass productivity can be realized.

Further, the television device may include a sub-screen 2008 formed using a second display panel to display channels, volume, or the like, in addition to the main screen 2003.

Figure 12:
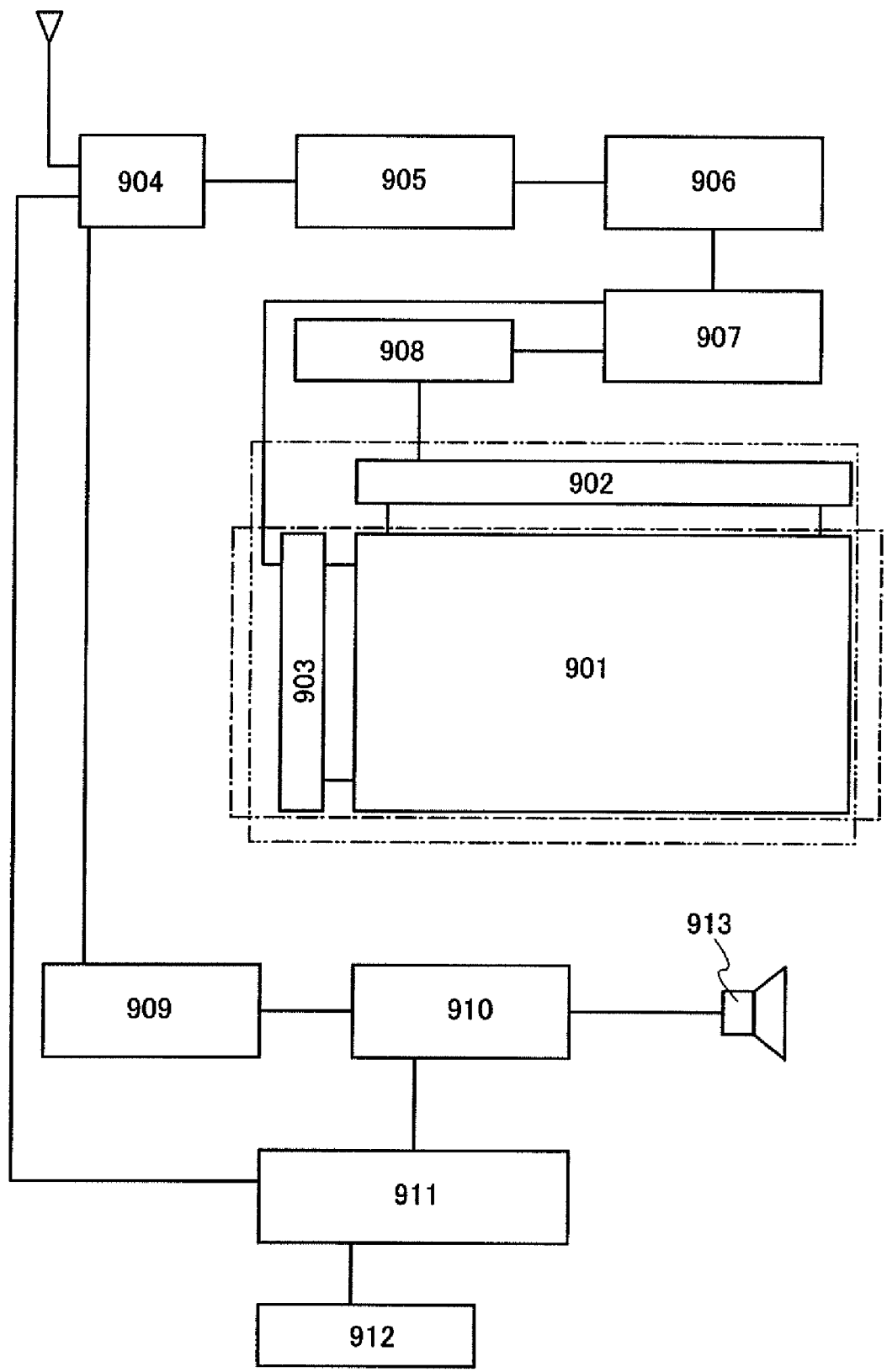
FIG. 12 is a block diagram showing a main structure of an electric device to which the present invention is applied.

FIG. 12 is a block diagram of a main structure of a television device. A pixel portion 901 is formed in a display panel. A signal line driver circuit 902 and a scan line driver circuit 903 may be mounted on the display panel by a COG method.

As for other external circuits, the television device includes a video signal amplifier circuit 905 which amplifies a video signal among signals received by a tuner 904; a video signal processing circuit 906 which converts a signal output from the video signal amplifier circuit 905 into a color signal corresponding to each color of red, green, and blue; a control circuit 907 which converts the video signal into an input specification of a driver IC; and the like. The control circuit 907 outputs a signal to each of the scan line side and the signal line side. In the case of digital drive, a signal dividing circuit 908 may be provided on the signal line side and an input digital signal may be divided into m pieces and supplied.

Audio signals among the signals received at the tuner 904 are transmitted to an audio signal amplifier circuit 909, and an output thereof is supplied to a speaker 913 through an audio signal processing circuit 910. A control circuit 911 receives control information of a receiving station (reception frequency) or sound volume from an input portion 912 and transmits signals to the tuner 904 or the audio signal processing circuit 910.

Needless to say, the present invention is not limited to a television device and can be applied to a variety of uses, such as a monitor of a personal computer, a large display medium such as an information display board at the train station, the airport, or the like, or an advertisement display board on the street.

Figure 11B:
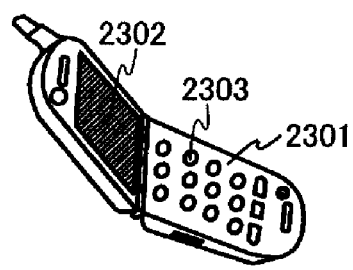
Figure 11C:
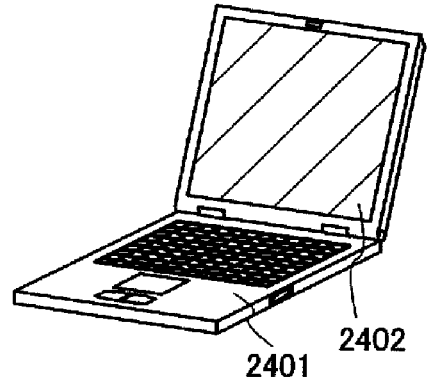

FIG. 11B shows an example of a mobile phone 2301. The mobile phone 2301 includes a display portion 2302, an operation portion 2303, and the like. The display device described in the above-described embodiment mode is applied to the display portion 2302, whereby reduction in cost and enhancement of mass productivity can be realized A portable computer shown in FIG. 11C includes a main body 2401, a display portion 2402, and the like. The display device described in the above-described embodiment modes is applied to the display portion 2402, whereby reduction in cost and enhancement of mass productivity can be realized.

Figure 11D:
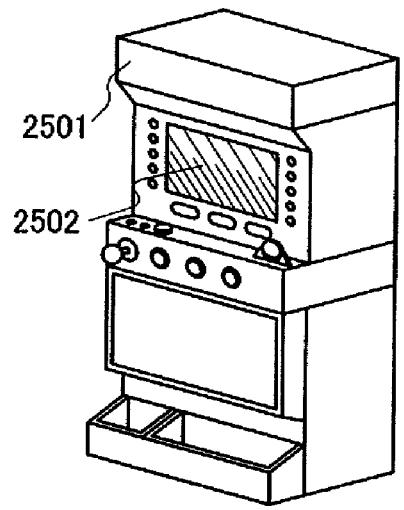

A slot machine shown in FIG. 11D, which is an example of a game machine, includes a main body 2501, a display portion 2502, and the like. The display device described in the above-described embodiment modes is applied to the display portion 2502, whereby reduction in cost and enhancement of mass productivity can be realized.

This application is based on Japanese Patent Application serial no. 2007-275786 filed with Japan Patent Office on Oct. 23, 2007, the entire contents of which are hereby incorporated by reference.

What is claimed is:

1. A method for manufacturing a display device, comprising the steps of:

forming, over a substrate, a first source wiring and a second source wiring with a gate wiring interposed therebetween;

forming an insulating film over the gate wiring, the first source wiring and the second source wiring;

forming a semiconductor film over the insulating film;

forming a first resist pattern over the semiconductor film, the first resist pattern including a first region having a first thickness and a second region having a second thickness which is thicker than the first thickness, by using a light-exposure mask through which light is transmitted to have a plurality of intensity;

forming a contact hole by etching the semiconductor film and the insulating film selectively, using the first resist pattern as a mask;

forming a second resist pattern over the semiconductor film, the second resist pattern including a third region which is included in the second region, by removing the first region of the first resist pattern;

forming a semiconductor pattern by etching the semiconductor film selectively, using the second resist pattern as a mask; and forming a stacked layer of a light-transmitting conductive film and a conductive film over the gate wiring, the first source wiring and the second source wiring.

2. The method for manufacturing a display device according to claim 1, wherein a light-transmitting substrate is used for the substrate.

3. The method for manufacturing a display device according to claim 1, wherein the semiconductor film includes an impurity imparting one conductivity type.

4. The method for manufacturing a display device according to claim 1, wherein a gray-tone mask is used as the light-exposure mask.

5. The method for manufacturing a display device according to claim 1, wherein a half-tone mask is used as the light-exposure mask.

6. A method for manufacturing a display device, comprising steps of:

forming a gate wiring layer over a light-transmitting substrate and a first source wiring layer and a second source wiring layer with the gate wiring layer interposed therebetween;

forming a gate insulating layer over the gate wiring layer, the first source wiring layer, and the second source wiring layer;

stacking a semiconductor film and a semiconductor film to which an impurity imparting one conductivity type is added, over the gate insulating layer;

forming a first mask layer over the semiconductor film to which an impurity imparting one conductivity type is added;

forming a first opening which reaches the first source wiring layer and a second opening which reaches the second source wiring layer by etching the gate insulating layer, the semiconductor film, and the semiconductor film to which an impurity imparting one conductivity type is added using the first mask layer;

performing ashing on the first mask layer to form a second mask layer;

forming a semiconductor layer and a semiconductor layer to which an impurity imparting one conductivity type is added, by etching the semiconductor film and the semiconductor film to which an impurity imparting one conductivity type is added using the second mask layer;

forming a stacked layer of a light-transmitting conductive film and a conductive film over the gate wiring layer, the first source wiring layer, the second source wiring layer, the gate insulating layer, the semiconductor layer, and the semiconductor layer to which an impurity imparting one conductivity type is added;

forming a third mask layer over the light-transmitting conductive film and the conductive film;

forming a semiconductor layer having a recessed portion, a source region, a drain region, source or drain electrode layers which are stacked layers of the light-transmitting conductive film and the conductive film by etching the light-transmitting conductive film and the conductive film using the third mask layer;

performing ashing on the third mask layer to form a fourth mask layer;

forming a pixel electrode layer by selectively etching the conductive film of the source or drain electrode layers using the fourth mask layer to expose the light-transmitting conductive film; and forming the source or drain electrode layers which connect the first source wiring layer and the second source wiring layer to each other electrically through the first opening and the second opening, wherein the first mask layer and the third mask layer are formed using light-exposure masks through which light is transmitted to have a plurality of intensity, and a region with a thickness smaller than that of a region which is overlapped with the source region and the drain region is included in the semiconductor layer having a recessed portion.

7. A method for manufacturing a display device according to claim 6, further comprising the steps of:

forming an insulating film to cover the semiconductor layer having a recessed portion and the source or drain electrode layers;

forming a fifth mask layer over the insulating film using light exposure with light which has transmitted through the light-transmitting substrate; and etching the insulating film using the fifth mask layer to expose the light-transmitting conductive film selectively.

8. A method for manufacturing a display device according to claim 6, further comprising the steps of forming an insulating film to cover the semiconductor layer having a recessed portion and the source or drain electrode layers;

forming a fifth mask layer over the insulating film using light exposure with light which has transmitted through the light-transmitting substrate;

heating the fifth mask layer to form a sixth mask layer whose area is larger; and etching the insulating film using the sixth mask layer to expose the light-transmitting conductive film selectively.

9. A method for manufacturing a display device according to claim 8, wherein a driver circuit is included over the light-transmitting substrate, and the light-transmitting conductive film which is exposed is electrically connected to the driver circuit via an anisotropic conductive film.

10. A method for manufacturing a display device according to claim 6, wherein a liquid crystal layer is formed over the pixel electrode layer.

* * * * *